US010256174B2

(12) United States Patent
Shin et al.

(10) Patent No.: US 10,256,174 B2
(45) Date of Patent: Apr. 9, 2019

(54) FILM TYPE SEMICONDUCTOR PACKAGE

(71) Applicant: Samsung Electronics Co., Ltd., Suwon-si (KR)

(72) Inventors: Na-rae Shin, Yongin-si (KR); Jun-ho Song, Seoul (KR); Ji-yong Park, Hwaseong-si (KR); Kyoung-suk Yang, Hwaseong-si (KR); Hee-jung Hwang, Suwon-si (KR); Young-hun Jung, Yongin-si (KR)

(73) Assignee: SAMSUNG ELECTRONICS CO., LTD., Samsung-ro, Yeongtong-gu, Suwon-si, Gyeonggi-do (KR)

( * ) Notice: Subject to any disclaimer, the term of this patent is extended or adjusted under 35 U.S.C. 154(b) by 28 days.

(21) Appl. No.: 15/400,334

(22) Filed: Jan. 6, 2017

(65) Prior Publication Data
US 2018/0005929 A1 Jan. 4, 2018

(30) Foreign Application Priority Data

Jul. 1, 2016 (KR) ........................ 10-2016-0083533

(51) Int. Cl.
H01L 23/498 (2006.01)
H01L 23/00 (2006.01)

(52) U.S. Cl.
CPC .... H01L 23/49816 (2013.01); H01L 23/4985 (2013.01); H01L 24/09 (2013.01); H01L 24/17 (2013.01); H01L 2224/0913 (2013.01); H01L 2224/1713 (2013.01)

(58) Field of Classification Search
CPC .......... H01L 23/4985; H01L 23/49816; H01L 2224/1713; H01L 2224/0913
See application file for complete search history.

(56) References Cited

U.S. PATENT DOCUMENTS

| 6,114,754 | A | 9/2000 | Kata |
| 6,198,522 | B1 | 3/2001 | Yanagi |
| 6,518,649 | B1 | 2/2003 | Iwane et al. |
| 6,603,071 | B2 | 8/2003 | Takao |
| 6,985,193 | B2 | 1/2006 | Jang |
| 7,226,814 | B2 | 6/2007 | Song |
| 7,582,976 | B2 | 9/2009 | Seko et al. |
| 7,683,471 | B2 | 3/2010 | Chung et al. |

(Continued)

FOREIGN PATENT DOCUMENTS

| JP | 2013-026291 | 2/2013 |
| KR | 10-2004-0000934 | 1/2004 |

(Continued)

Primary Examiner — Tucker J Wright
Assistant Examiner — Wilner Jean Baptiste
(74) Attorney, Agent, or Firm — Muir Patent Law, PLLC

(57) ABSTRACT

A film type semiconductor package includes a film substrate; a metal pattern extending a first length in a first direction on the film substrate, having a first width in a second direction perpendicular to the first direction the first length being larger than the first width, and includes a plurality of through holes spaced apart from each other in the first direction; a semiconductor chip including a plurality of pads; and a plurality of bumps spaced apart from each other in the first direction, bonded with the metal pattern, and overlapping the plurality of through holes and connected to the pads of the semiconductor chip.

20 Claims, 18 Drawing Sheets

(56) References Cited

U.S. PATENT DOCUMENTS

| | | |
|---|---|---|
| 7,732,933 B2 | 6/2010 | Chung et al. |
| 7,906,374 B2 | 3/2011 | Lin et al. |
| 8,058,713 B2 | 11/2011 | Nakayama |
| 8,269,322 B2 | 9/2012 | Kim |
| 8,395,908 B2 | 3/2013 | Kim |
| 8,529,997 B2 | 9/2013 | Heuft et al. |
| 8,853,694 B2 | 10/2014 | Han et al. |
| 9,177,882 B2 | 11/2015 | Inokuchi et al. |
| 9,184,148 B2 | 11/2015 | Jeon et al. |
| 2006/0091504 A1 | 5/2006 | Kang et al. |
| 2007/0013063 A1* | 1/2007 | Khandekar ............. H01L 24/81 257/734 |
| 2007/0122146 A1 | 5/2007 | Ryu |
| 2007/0210442 A1* | 9/2007 | Hess ..................... H01L 23/522 257/700 |
| 2008/0119061 A1 | 5/2008 | Hwang et al. |
| 2014/0327133 A1 | 11/2014 | Lin |
| 2014/0327134 A1 | 11/2014 | Lin |
| 2014/0369009 A1 | 12/2014 | Cho |
| 2015/0228587 A1* | 8/2015 | Cheng ................... H01L 23/544 257/777 |

FOREIGN PATENT DOCUMENTS

| | | |
|---|---|---|
| KR | 10-2005-0019233 | 3/2005 |
| KR | 10-2007-0038234 | 4/2007 |
| KR | 10-2010-0086851 | 8/2010 |

\* cited by examiner

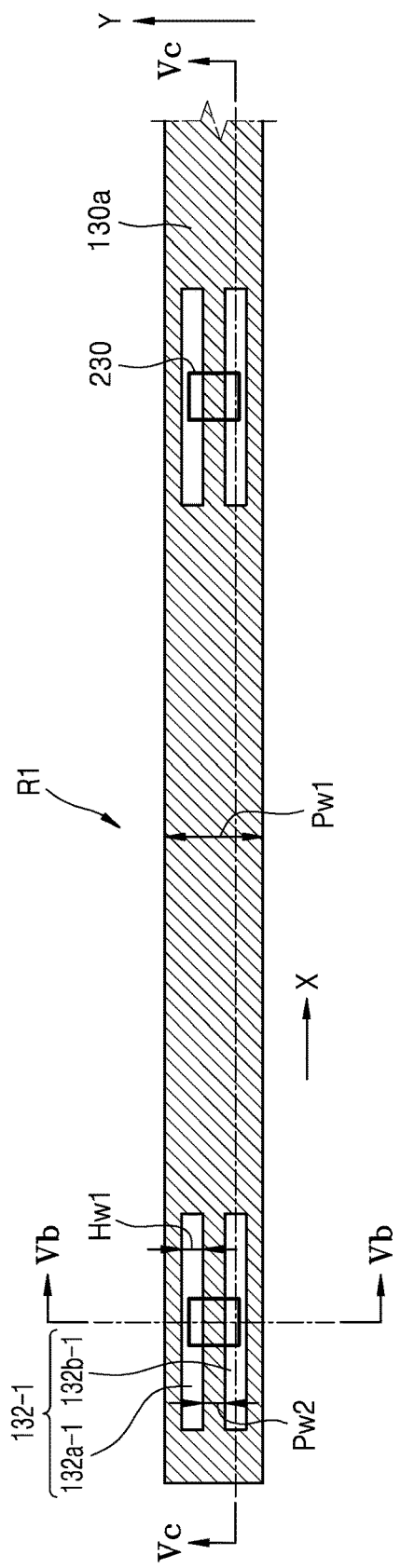

FILM TYPE SEMICONDUCTOR PACKAGE

CROSS-REFERENCE TO RELATED APPLICATION

This application claims the benefit of priority under 35 U.S.C. § 119 to Korean Patent Application No. 10-2016-0083533, filed on Jul. 1, 2016, in the Korean Intellectual Property Office, the disclosure of which is incorporated herein in its entirety by reference.

BACKGROUND

The present disclosure relates to a semiconductor package, and more particularly, to a film type semiconductor package including a film substrate.

A film type semiconductor package, for example, a chip on film (COF) semiconductor package, may be configured by mounting a semiconductor chip on a film substrate in a flip chip manner and bonding pads of a semiconductor chip to a metal pattern (or a lead) on the film substrate by using a bump. The film type semiconductor package may be connected to an external circuit through an in/out pin connected to the metal pattern on the film substrate.

As a small, thin, lightweight, and high capacity semiconductor product has been recently developed, an electrical characteristic of the metal pattern on the film substrate, for example, a resistance characteristic of the film type semiconductor package, needs to be enhanced. Also, a bonding characteristic of the bump formed on the semiconductor chip and the metal pattern on the film substrate in the film type semiconductor package needs to be enhanced.

SUMMARY

The present disclosure provides a film type semiconductor package having an enhanced bonding characteristic of a bump formed on a semiconductor chip and a metal pattern on a film substrate and an enhanced electrical characteristic of the metal pattern bonded with the bump, for example, a resistance characteristic.

According to an aspect of the inventive concept, there is provided a film type semiconductor package including a film substrate; a metal pattern extending a first length in a first direction on the film substrate, having a first width in a second direction perpendicular to the first direction, wherein the first length in the first direction is larger than the first width in the second direction, and comprising a plurality of through holes spaced apart from each other in the first direction; a semiconductor chip comprising a plurality of pads; and a plurality of bumps spaced apart from each other in the first direction, bonded with the metal pattern, and overlapping the plurality of through holes and connected to the pads of the semiconductor chip.

According to another aspect of the inventive concept, there is provided a film type semiconductor package including a film substrate; a plurality of metal patterns extending in a first direction on the film substrate and being spaced apart from each other in a second direction perpendicular to the first direction, some of the plurality of metal patterns comprising a plurality of through holes spaced apart from each other in the first direction; and a semiconductor chip comprising a plurality of bumps directly bonded with the plurality of metal patterns or overlapping the plurality of through holes, and bonded with the plurality of metal patterns.

According to another aspect of the inventive concept, there is provided a film type semiconductor package including a film substrate; a metal pattern having a first length in a first direction on the film substrate, and a second length in a second direction perpendicular to the first direction, wherein the first length is larger than the second length, and comprising a plurality of through holes spaced apart from each other in the first direction; and a semiconductor chip comprising a plurality of bumps spaced apart from each other in the first direction, the bumps bonded with the metal pattern and overlapping the plurality of through holes.

BRIEF DESCRIPTION OF THE DRAWINGS

Example embodiments of the inventive concept will be more clearly understood from the following detailed description taken in conjunction with the accompanying drawings in which:

FIGS. 5A through 5D are diagrams for describing a bonding portion between a metal pattern and bumps of FIG. 4;

DETAILED DESCRIPTION OF THE EMBODIMENTS

Figure 1:
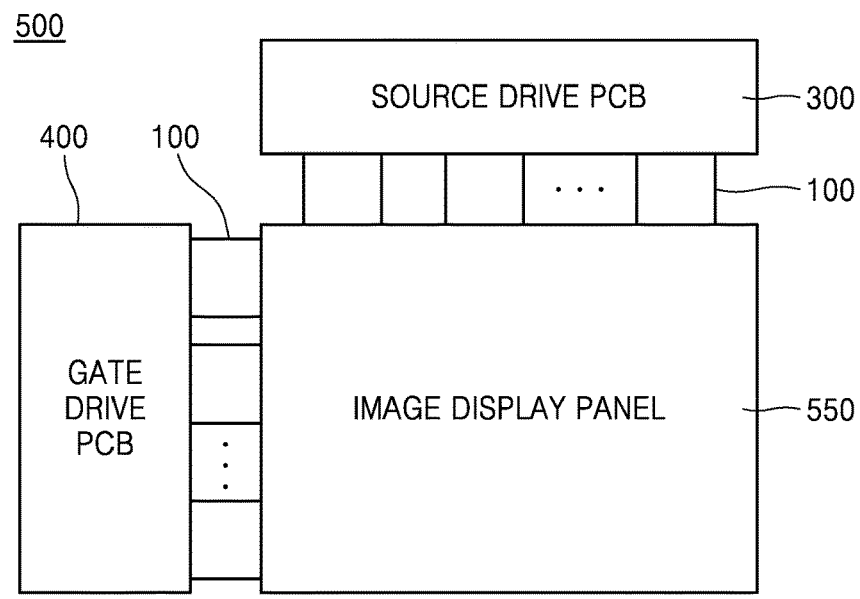
FIG. 1 is a schematic block diagram of a display device including a film type semiconductor package according to an exemplary embodiment.

The present disclosure now will be described more fully hereinafter with reference to the accompanying drawings, in which various embodiments are shown. The invention may, however, be embodied in many different forms and should not be construed as limited to the example embodiments set forth herein. These example embodiments are just that—examples—and many implementations and variations are possible that do not require the details provided herein. It should also be emphasized that the disclosure provides details of alternative examples, but such listing of alternatives is not exhaustive. Furthermore, any consistency of detail between various examples should not be interpreted as requiring such detail—it is impracticable to list every possible variation for every feature described herein. The language of the claims should be referenced in determining the requirements of the invention.

It will be understood that when an element is referred to as being "connected" or "coupled" to or "on" another element, it can be directly connected or coupled to or on the other element or intervening elements may be present. In contrast, when an element is referred to as being "directly connected" or "directly coupled" to another element, or as "contacting" or "in contact with" another element, there are no intervening elements present. Other words used to describe the relationship between elements should be interpreted in a like fashion (e.g., "between" versus "directly between," "adjacent" versus "directly adjacent," etc.).

As used herein, and unless indicated otherwise, items described as being "electrically connected" are configured such that an electrical signal can be passed from one item to the other. Therefore, a passive electrically conductive component (e.g., a wire, pad, internal electrical line, etc.) physically connected to a passive electrically insulative component (e.g., a prepreg layer of a printed circuit board, an electrically insulative adhesive connecting two devices, an electrically insulative underfill or mold layer, etc.) that does not permit electric current to pass therethrough is not electrically connected to that component. Moreover, items that are "directly electrically connected," to each other are electrically connected through one or more passive elements, such as, for example, wires, pads, internal electrical lines, through vias, etc. As such, directly electrically connected components do not include components electrically connected through active elements, such as transistors or diodes. Directly electrically connected elements may be directly physically connected and directly electrically connected.

The various pads of a device described herein may be conductive terminals connected to internal wiring of the device, and may transmit signals and/or supply voltages between an internal wiring and/or internal circuit of the device and an external source. For example, chip pads of a semiconductor chip may electrically connect to and transmit supply voltages and/or signals between an integrated circuit of the semiconductor chip and a device to which the semiconductor chip is connected. The various pads may be provided on or near an external surface of the device and may generally have a planar surface area (often larger than a corresponding surface area of the internal wiring to which they are connected) to promote connection to a further terminal, such as a bump or solder ball, and/or an external wiring.

A film type semiconductor package of the inventive concept, for example, a chip on film (COF) semiconductor package, may be applied to a portable terminal device, a laptop computer, or a display device, for example, a flat panel display device. The display device may be driven by a semiconductor chip having many input/output terminals that perform various functions, and an image display panel may be further thinner, and thus the film type semiconductor package may be applied to the display device.

An example in which a film type semiconductor package is applied to a semiconductor chip used in a display device, for example, a display drive integrated circuit (IC) will be described below for convenience of description. The display drive IC may be named as a display driver IC.

FIG. 1 is a schematic block diagram of a display device 500 that uses a film type semiconductor package 100 according to an exemplary embodiment.

In more detail, the display device 500 may include the film type semiconductor package 100, a source drive printed circuit board (PCB) 300, a gate drive PCB 400, and an image display panel 550. A COF semiconductor package may be applied to the film type semiconductor package 100. The film type semiconductor package 100 may receive a signal that is output from the source drive PCB 300 and the gate drive PCB 400 and transmit the signal to the image display panel 550.

Figure 2:
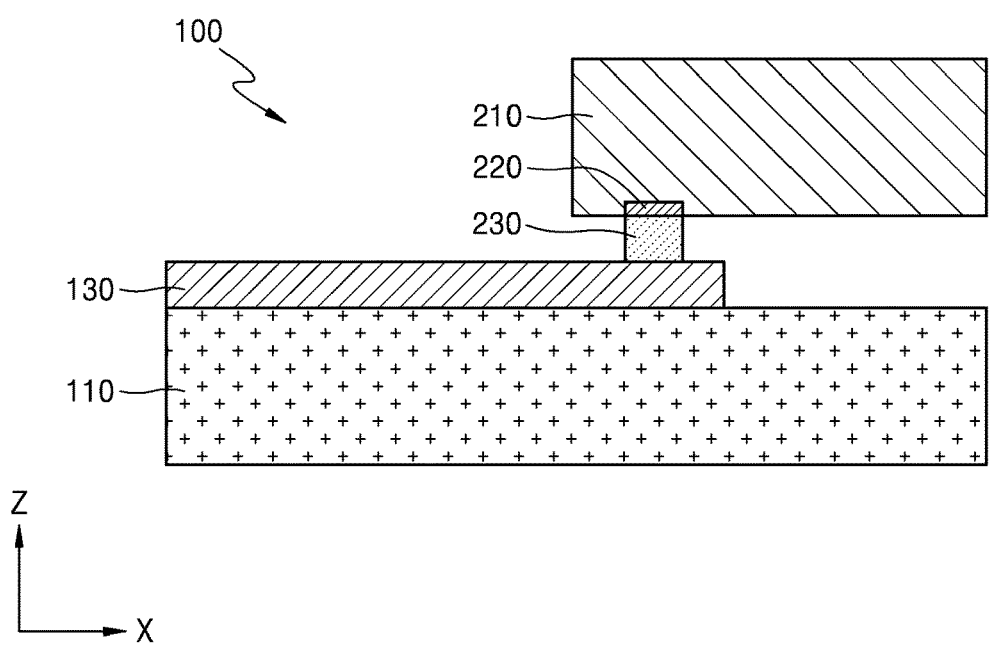
FIG. 2 is a schematic lateral view of a part of the film type semiconductor package of FIG. 1.

FIG. 2 is a schematic lateral view of a part of the film type semiconductor package 100 of FIG. 1.

In more detail, the film type semiconductor package 100 may include a film substrate 110 and a metal pattern 130 (or a lead) formed on the film substrate 110. The film substrate 110 may be a polyimide substrate. The metal pattern 130 may be a copper pattern. The film substrate 110 and the metal pattern 130 may be named as film members.

The film type semiconductor package 100 may include a semiconductor chip 210 having a pad 220 formed in one surface of the semiconductor chip 210 and a bump 230 formed on the pad 220 of the semiconductor chip 210. The pad 220 may be a copper pad or an aluminum pad. The bump 230 may be a gold (Au) bump.

The film type semiconductor package 100 may be configured by bonding the bump 230 formed on the pad 220 of one surface of the semiconductor chip 210 and the metal pattern 130 on the film substrate 110. The bump 230 may be arranged on an active surface of the semiconductor chip 210, i.e., a surface in which a circuit is formed and may protrude at a predetermined height in a Z direction. The bump 230 may be formed on an edge part or a center part of the semiconductor chip 210. A location in which the bump 230 is formed will be described in detail below.

According to this exemplary embodiment, in the film type semiconductor package 100, the semiconductor chip 210 and the metal pattern 130 may be electrically connected to each other through the bump 230 formed on one surface of the semiconductor chip 210, and the metal pattern 130 may be electrically connected to input/output pins (not shown) on the film substrate 110.

Although one pad 220 and one bump 230 of the semiconductor chip 210 are illustrated in FIG. 2 for convenience of illustration, a plurality of pads 220 and a plurality of bumps 230 of the semiconductor chip 210 may be formed. As a small, thin, lightweight, and high capacity semiconductor product has been recently developed, the demands for utilizing number of the pads 220 and the bumps 230 have also been increased recently.

Accordingly, the film type semiconductor package 100 needs a good bonding characteristic of the bump 230 formed on one surface of the semiconductor chip 210 and metal pattern 130 on the film substrate 110. For example, the film type semiconductor package 100 may not detach (separate) the bump 230 and the metal pattern 130 from each other. For example, the bump 230 and the metal pattern 130 should maintain a physical contact. In addition, the film type semiconductor package 100 needs a good electrical characteristic of the metal pattern 130, for example, a resistance characteristic, since a length of the metal pattern 130 increases as demands for a small, thin, lightweight, and high capacity semiconductor product increase.

Figure 3:
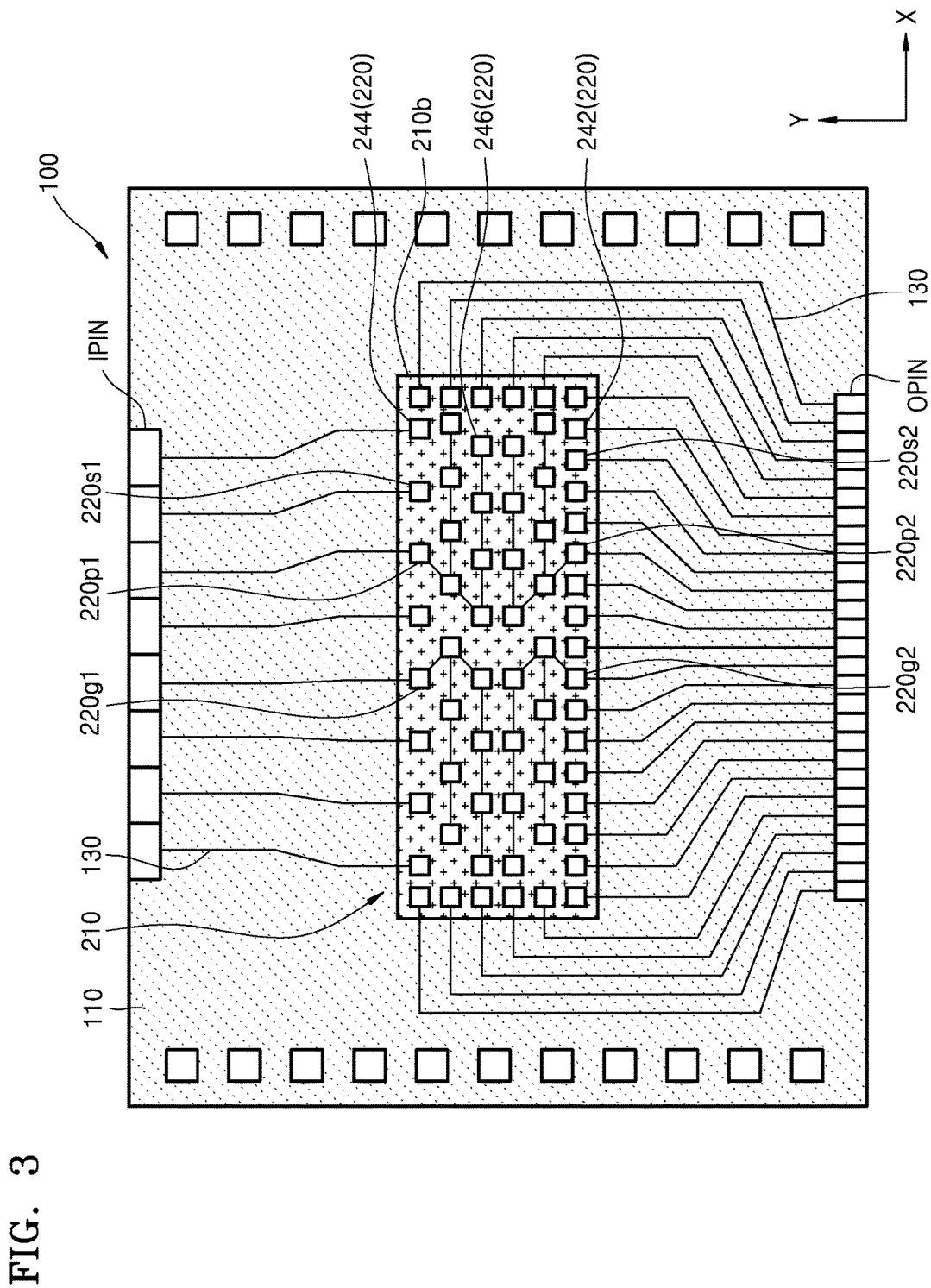
FIG. 3 is a schematic diagram of the film type semiconductor package of FIGS. 1 and 2.

FIG. 3 is a schematic diagram of the film type semiconductor package 100 of FIGS. 1 and 2.

In more detail, the same reference numerals denote the same components in FIGS. 1 through 3. In FIG. 3, the bump 230 of FIG. 2 formed on the pad 220 is not illustrated for description of the pad 220.

With respect to the semiconductor chip 210, the pads 220 is arranged over an active surface of the semiconductor chip 210. However, as semiconductor chip 210 on film substrate 110 is connected to the film substrate in a face down configuration, the pads 220 are arranged on a lower surface of a chip body 210b. As will be appreciated, pads 220 are input/output terminals of the chip and connect to internal circuits in the chip 210 to transmit signals and power. FIG. 3 shows one of various examples of the metal pattern 130 located in the chip body 210 of the semiconductor chip 210 according to its design.

The film type semiconductor package 100 may include the film substrate 110, the metal pattern 130, the semiconductor chip 210, and the pad 220. An output pin OPIN may be formed in one end of the film substrate 110 and an input pin IPIN may be formed in another end thereof. It will be appreciated that the term "pin" refers to an I/O terminal of the package, and need not comprise a prong. For example, a "pin" may be an edge connector or a conductive pad.

The semiconductor chip 210 may be mounted in the film substrate 110. The pad 220 of the semiconductor chip 210 may include edge pads 242 and 244 formed in an edge part of the chip body 210b and a center pad 246 formed in an inner center region of the chip body 210b.

The edge pads 242 and 244 and the center pad 246 may be formed on the film substrate 110 and may be connected to each other by the metal pattern 130 formed in the chip body 210b. The edge pads 242 and 244 and the center pad 246 may be electrically connected to the input and output pins IPIN and OPIN through the bump 230 of FIG. 2 and the metal pad 130. Input pins IPIN may connect to pads 220 of the semiconductor chip 210 that in turn are connected to input latches (latch circuits) of the semiconductor chip 210 to latch information (e.g., data) or connected to an internal power supply circuit of the semiconductor chip 210 that supplies power to the circuits of the chip. Output pins OPIN may be connected to pads 220 of the semiconductor chip 210 that are in turn are connected to output drivers (driver circuits) of the chip, so that the output drivers may provide signals to the output pins OPIN to be output from package 100.

The number or arrangement shapes of the edge pads 242 and 244 and the center pad 246 may vary according to their designs. For example, in some embodiments, the number of input pins IPIN may be less than the number of output pins OPIN. Therefore, the number of edge pads 242 and 244 connected to the input pins IPIN may be less than the number of edge pads 242 and 244 connected to the output pins OPIN. In some embodiments, the center pad 246 formed in the inner center region of the chip body 210b may be used as a power pad or a ground pad in order to enhance an electrical characteristic of the semiconductor chip 210.

The edge pad 244 formed in the edge part of the chip body 210b located closer to the input pins IPIN may include signal input pads 220s1, input power pads 220p1, and input side ground pads 220g1. The edge pad 242 formed in the other edge part of the chip body 210b located closer to the output pins OPIN may include signal output pads 220s2, output side power pads 220p2, and output side ground pads 220g2. However, the disclosure is not limited thereto. For example, in some embodiments, some of the edge pads 242 and 244 may be configured as signal input pads 220s1 and output pads 220s2 and remaining edge pads 242 and 244 may be used as power pads 220p1, 220p2 or ground pads 220g1, 220g2.

Figure 4:
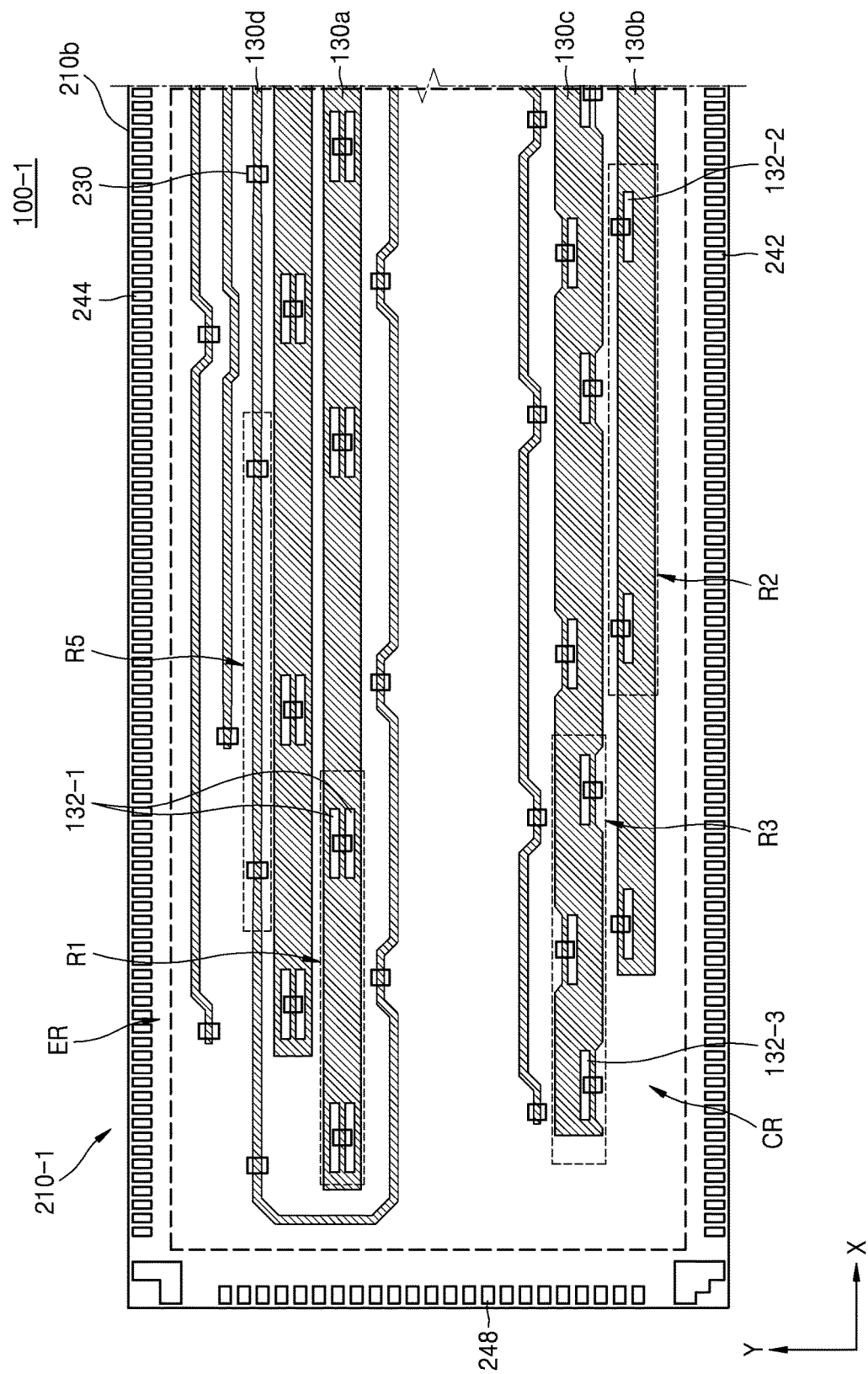
FIG. 4 is a diagram for describing a film type semiconductor package according to an exemplary embodiment.

FIG. 4 is a diagram for describing a film type semiconductor package 100-1 according to an exemplary embodiment.

In more detail, the film type semiconductor package 100-1 of FIG. 4 may correspond to the film type semiconductor package 100 of FIGS. 1 through 3. The film type semiconductor package 100-1 of FIG. 4 may be provided to describe a semiconductor chip 210-1 having a plurality of bumps 230 and a plurality of metal patterns 130a through 130d bonded with the semiconductor chip 210-1 through the bumps 230. The bump 230 of FIG. 4 may have a rectangular shape.

FIG. 4 shows only a part of the film type semiconductor package 100-1. The semiconductor chip 210-1 may correspond to the semiconductor chip 210 of FIGS. 2 and 3. The metal patterns 130a through 130d may correspond to the metal pattern 130 of FIGS. 2 and 3. The same reference numerals denote the same components in FIGS. 2 through 4.

The semiconductor chip 210-1 may include a plurality of edge pads 242, 244, and 248 formed in an edge region ER of the chip body 210b and a plurality of center pads (not shown) and the plurality of bumps 230 formed in a center region CR.

In FIG. 4, since the bumps 230 may overlap each other to form the center pads, the center pads are not illustrated. The center pads, as described above, may be used as power pads or ground pads in order to enhance an electrical characteristic of the semiconductor chip 210-1. The edge pads 242 and 244 may be configured as signal input and output pads. Some of the edge pads 242 and 244 may be used as power pads or ground pads. The edge pads 248 may be used as dummy pads if necessary.

The metal patterns 130a through 130d may be formed on the film substrate 110 of FIG. 2. In FIG. 4, the film substrate 110 of FIG. 2 is not illustrated for convenience of illustration in order to describe bonding between the metal patterns 130a through 130d and the bumps 230. The metal patterns 130a through 130d may extend at a certain length in a first direction (a length direction), for example, an X direction, and may have a certain width in a second direction (a width direction) perpendicular to the first direction, for example, a Y direction on the film substrate 110 of FIG. 2. Widths of the metal patterns 130a through 130d may be different.

Through holes 132-1, 132-2, and 132-3 that penetrate the metal patterns 130a through 130c may be arranged in the metal patterns 130a through 130c among the metal patterns 130a through 130d. A plurality of the through holes 132-1, 132-2, and 132-3 may be spaced apart from each other in the first direction (the length direction), for example, the X direction.

As described above, the semiconductor chip 210-1 may be mounted on the film substrate 110 of FIG. 2 and the metal patterns 130a through 130d.

More specifically, the bumps 230 formed on one surface of the semiconductor chip 210-1 may overlap the through holes 132-1, 132-2, and 132-3 and may be bonded with the metal patterns 130a through 130c. When the bumps 230 overlap the through holes 132-1, 132-2, and 132-3 and are bonded with the metal patterns 130a through 130c, a bonding characteristic of the bumps 230 and the metal patterns 130a through 130c may be enhanced while not reducing an electrical characteristic, for example, a resistance characteristic.

For example, the bumps 230 may be bonded with the metal patterns 130a through 130c having a relatively broader width, and thus the electrical characteristic, for example, the resistance characteristic may not deteriorate.

When the bumps 230 overlap the through holes 132-1, 132-2, and 132-3 and are bonded with the metal patterns 130a through 130c, the bumps 230 may not be separated from the metal patterns 130a through 130c and may maintain a physical contact with the metal patterns 130a through 130c, and thus the bonding characteristic may be enhanced.

In some embodiments, the bumps 230 formed on one surface of the semiconductor chip 210-1 may be directly bonded with the metal pattern 130d if necessary. The metal pattern 130d may have a smaller width than those of the metal patterns 130a through 130c. Accordingly, even when the metal pattern 130d is directly bonded with the bumps 230 through a through hole, the metal pattern 130d and the bumps 230 may be bonded with each other without being separated from each other.

The through holes 132-1, 132-2, and 132-3 having various shapes may be formed in the metal patterns 130a through 130c in order to enhance the bonding characteristic of the metal patterns 130a through 130c and the bumps 230. The film type semiconductor package 100-1 of FIG. 4 may include bonding portions R1, R2, R3, and R5 of the metal patterns 130a through 130c and the bumps 230.

Among the bonding portions R1, R2, R3, and R5, the bonding portions R1, R2, and R3 that bond the metal patterns 130a through 130c and the bumps 230 by using the through holes 132-1, 132-2, and 132-3 will be described in detail with reference to FIGS. 5 through 7 below.

FIGS. 5A through 5D are diagrams for describing the bonding portion R1 between the metal pattern 130a and the bumps 230 of FIG. 4.

Figure 5B:
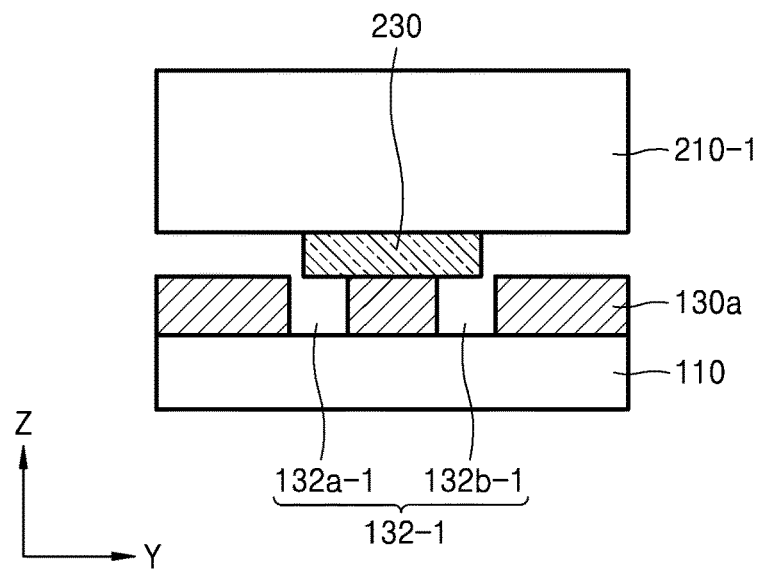
Figure 5C:
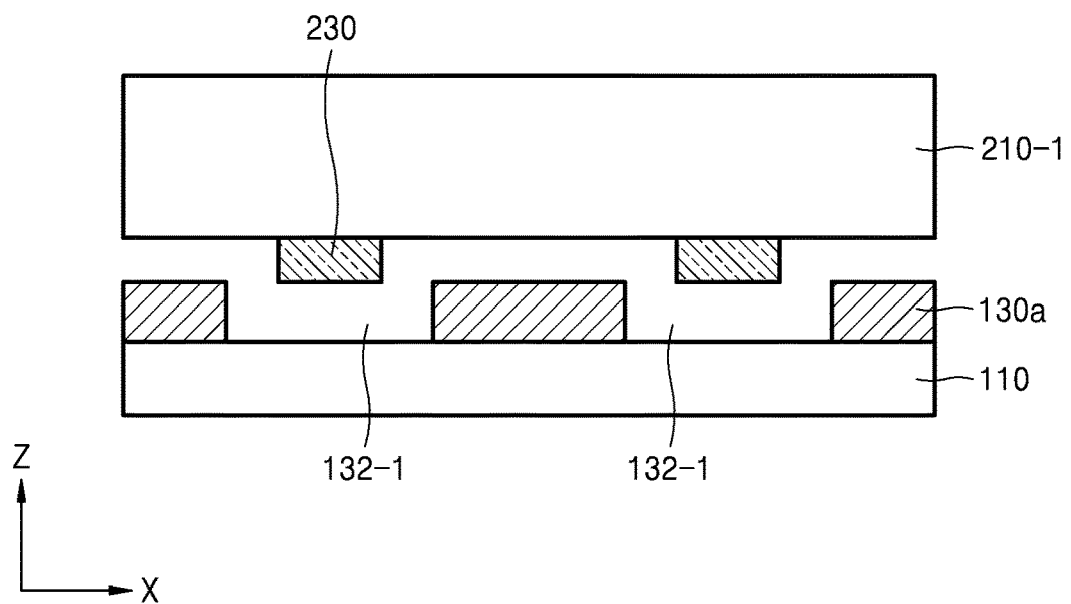

In more detail, FIG. 5A is a plan view for describing the bonding portion R1 between the metal pattern 130a and the bumps 230, and FIGS. 5B and 5C are cross-sectional views taken along lines Vb-Vb and Vc-Vc of FIG. 5A, respectively. The metal pattern 130a may extend in a first direction (a length direction), i.e., an X direction, and may have a width Pw1 in a second direction (a width direction), i.e., a Y direction. The through holes 132-1 may have a long length in the first direction (the length direction), i.e., the X direction and may have a short width in the second direction (the width direction), i.e., the Y direction. For example, a length of the through holes 132-1 in a first direction (a length direction), i.e., the X direction, may be larger than a length of the through holes 132-1 in a second direction (a width direction), i.e., the Y direction. In some examples, the length of the through holes 132-1 in the X direction (length direction) may be larger than the width of in the X direction of the associated bump 230 positioned over and/or within the through hole 132-1, but smaller than a several times the width in the X direction of the associated bump positioned over and/or within the through hole 132-1, such as less than 10 times, less than 5 times or less than about 2 times such width of the associated bump 230. The width of the associated bump in the Y-direction may be larger than the width in the Y-direction of the corresponding through hole 132-1 over and/or within which it is positioned, such as by 1.2 times or greater or by 2 times or greater. A bump 230 may have substantially the same widths in the X-direction and Y direction, and may have different shapes with respect to the top down view of FIG. 4 than a square or rectangular, such as circular (e.g., the bump 230 may be formed as a pillar or ball).

The through holes 132-1 may include a plurality of sub through holes 132a-1 and 132b-1 in the second direction (the width direction), i.e., the Y direction. Each of the sub through holes 132a-1 and 132b-1 may have a width Hw1 in the second direction, i.e., the Y direction. In some embodiments, each of the sub through holes 132a-1 and 132b-1 may have a same width Hw1 in the second direction, i.e., the Y direction, and may have a same length in the first direction, but the disclosure is not limited thereto. The metal pattern 130a between the sub through holes 132a-1 and 132b-1 may have a width Pw2. In FIG. 5A, although the through holes 132-1 includes the two sub through holes 132a-1 and 132b-1, the through holes 132-1 may include two or more sub through holes if necessary.

As shown in FIGS. 5B and 5C, the semiconductor chip 210-1 including the bumps 230 may be bonded on the metal pattern 130a formed on the film substrate 110 by using a thermal compression method. The through holes 132-1 may be located in the metal pattern 130a. The through holes 132-1 and the bumps 230 may be located at the same level (or at the same line) in the second direction, i.e., the Y direction on the metal pattern 130a. For example, the through hole 132-1 and the bump 230 located at one end of the metal pattern 130a may be positioned at the same level (or at the same line) in the second direction, i.e., the Y direction as the through hole 132-1 and the bump 230 located at the other end of the metal pattern 130a.

Figure 5D:
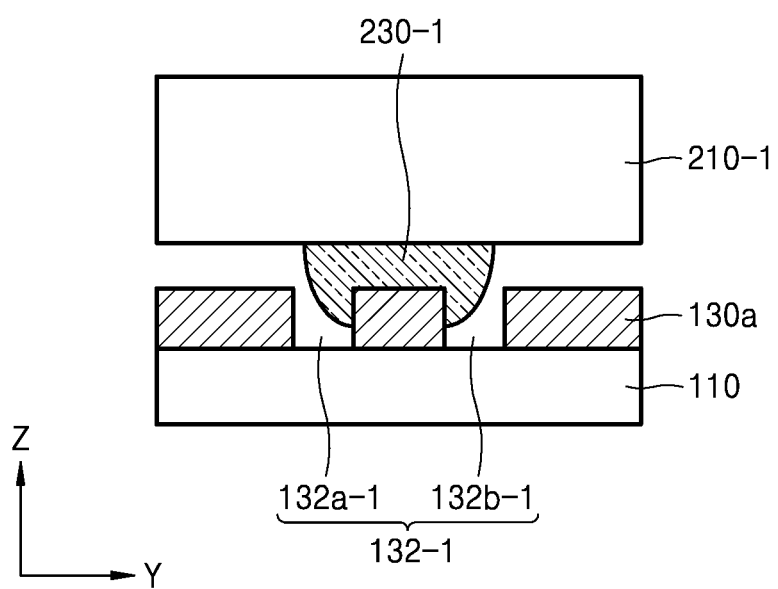

The bumps 230 may be located on the through holes 132-1 as shown in FIG. 5C. The bumps 230 may be bonded with the metal pattern 130a between the sub through holes 132a-1 and 132b-1, e.g., first through hole 132a-1 and a second through hole 132b-1, as shown in FIG. 5B. The bumps 230 may partially overlap the metal pattern 130a due to the through holes 132-1 as shown in FIG. 5B. The bumps 230 bonded with the metal pattern 130a may partially overlap the through holes 132-1. In some embodiments, as shown in FIG. 5D, the bump 230-1 connects the top surface and sidewalls of the metal pattern 130a providing a larger contact surface between the metal pattern 130a and the bump 230-1 than would exist if the first through hole 132a-1 and the second through hole 132b-1 were not provided.

In some embodiments, a first width in the second direction (Y-direction) Pw1 of the metal pattern 130a between the outermost edges of the metal pattern 130a, may be larger than a second width in the second direction (Y-direction) Pw2 of the portion of the metal pattern 130a bonded with the bumps 230 between the sub through holes 132a-1 and 132b-1. The metal pattern 130a bonded with the bumps 230 may have the comparatively smaller width Pw2 and the comparatively larger width Pw1 in the first direction, i.e., the X direction. Accordingly, the bonding portion R1 may have a comparatively larger width Pw1, and thus a resistance characteristic of the metal pattern 130a may not deteriorate, and the bumps 230 may be located on the metal pattern 130a having a comparatively smaller width Pw2, and thus a bonding characteristic may not deteriorate.

Figure 6A:
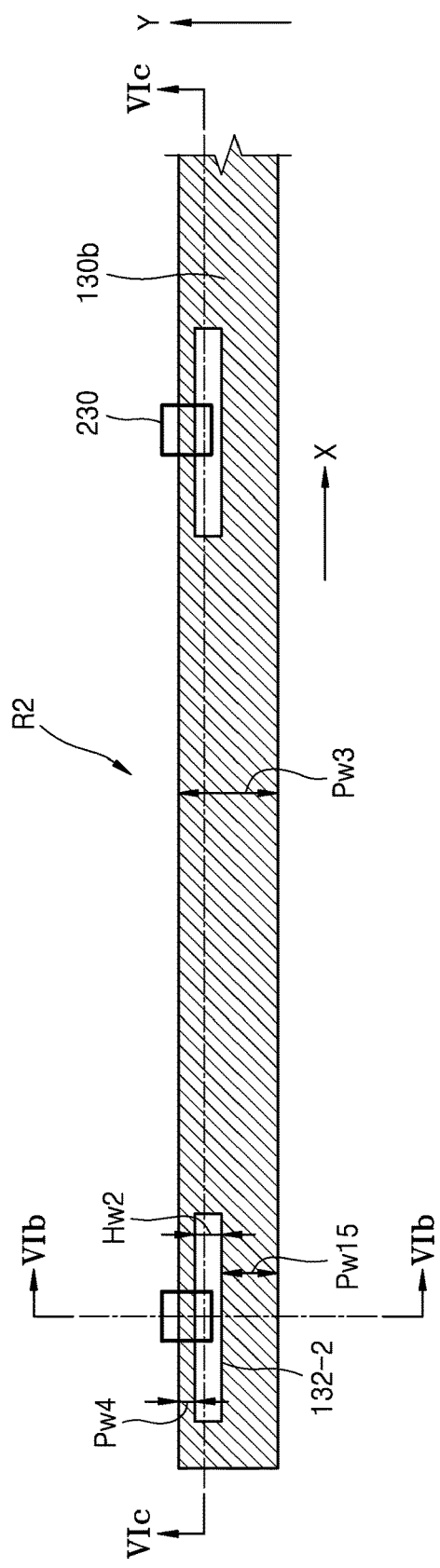
FIGS. 6A through 6C are diagrams for describing a bonding portion between a metal pattern and bumps of FIG. 4.
Figure 6B:
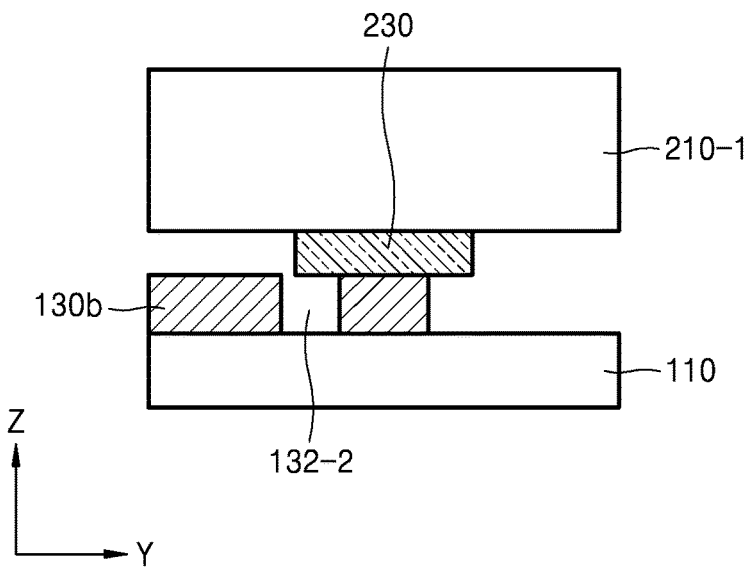
Figure 6C:
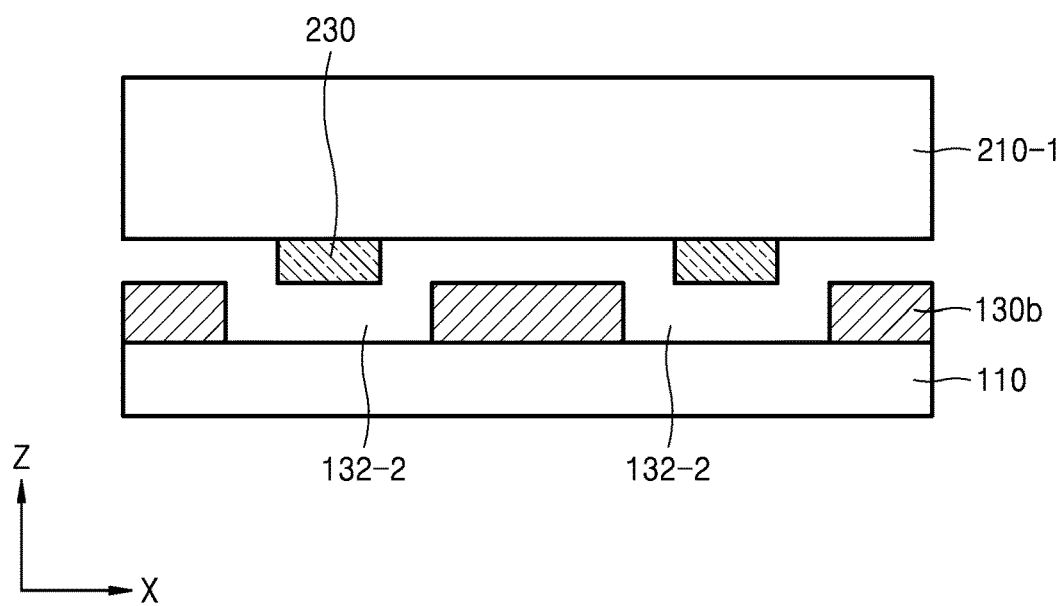

FIGS. 6A through 6C are diagrams for describing the bonding portion R2 between the metal pattern 130b and the bumps 230 of FIG. 4.

In more detail, FIG. 6A is a plan view for describing the bonding portion R2 between the metal pattern 130b and the bumps 230, and FIGS. 6B and 6C are cross-sectional views taken along lines VIb-VIb and VIc-VIc of FIG. 5A, respectively. The metal pattern 130b may extend in a first direction (a length direction), i.e., an X direction, and may have a width Pw3 in a second direction (a width direction), i.e., a Y direction. The through holes 132-2 may be spaced apart from each other in the first direction, i.e., the X direction in the metal pattern 130b. The through holes 132-2 may have a width Hw2 in the second direction, i.e., the Y direction. The metal pattern 130b of one side in contact with the through holes 132-2 may have a comparatively smaller width Pw4 and a comparatively larger width Pw15. For example, the width Pw15 is larger than the width Pw4 in the second direction, i.e., the Y direction.

The semiconductor chip 210-1 including the bumps 230 may be bonded on the metal pattern 130b formed on the film substrate 110 by using a thermal compression method. The through holes 132-2 and the bumps 230 may be located at the same level in the second direction on the metal pattern 130b. For example, the through hole 132-2 and the bump 230 located at one end of the metal pattern 130b may be positioned at the same level (or at the same line) in the second direction, i.e., the Y direction as the through hole 132-2 and the bump 230 located at the other end of the metal pattern 130b.

The bumps 230 may be located on the through holes 132-2 and outside the metal pattern 130b as shown in FIG. 6C, and thus the bumps 230 may partially overlap the film substrate 110. The bumps 230 may partially overlap the metal pattern 130b due to the through holes 132-2 as shown in FIG. 6B. The bumps 230 bonded with the metal pattern 130b may partially overlap the through holes 132-2.

The metal pattern 130b bonded with the bumps 230 may have a comparatively smaller width Pw4 and a comparatively larger width Pw3 in the first direction, i.e., the X direction. For example, the width Pw3 is larger than the width Pw4 in the second direction, i.e., the Y direction. Accordingly, the bonding portion R2 may have the larger width Pw15, and thus a resistance characteristic may not deteriorate, and the bumps 230 may be located on the metal pattern 130b having the smaller width Pw4, and thus a bonding characteristic may not deteriorate.

Figure 7:
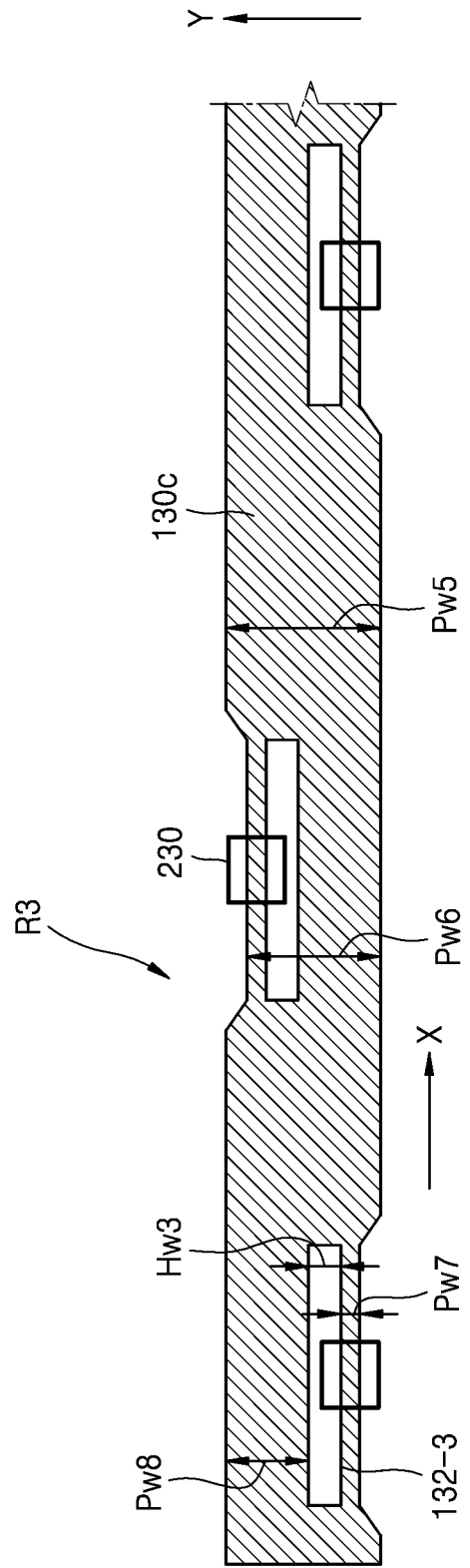
FIG. 7 is a diagram for describing a bonding portion between a metal pattern and bumps of FIG. 4.

FIG. 7 is a diagram for describing the bonding portion R3 between the metal pattern 130c and the bumps 230 of FIG. 4. FIG. 7 is almost the same as FIG. 6A, except that the through holes 132-3 and the bumps 230 may be located at different levels in a first direction (a length direction), i.e., an X direction on the metal pattern 130c.

The metal pattern 130c may extend in the first direction (the length direction), i.e., the X direction, and may have widths Pw5 and Pw6 in a second direction (a width direction), i.e., a Y direction. The widths Pw5 and Pw6 may be different or the same. The through holes 132-3 may be spaced apart from each other in the first direction, i.e., the X direction in the metal pattern 130c. The through holes 132-3 may have a width Hw3 in the second direction, i.e., the Y direction. The metal pattern 130c of one side in contact with the through holes 132-3 may have a comparatively smaller width Pw7 and a comparatively larger width Pw8. For example, the width Pw7 is smaller than the width Pw8 in the second direction, i.e., the Y direction.

As described above, the bumps 230 may be bonded on the metal pattern 130c by using a thermal compression method. The through holes 132-3 and the bumps 230 may be located at different levels in the second direction on the metal pattern 130c. For example, as illustrated in FIG. 7, the through hole 132-3 and the bump 230 located at one end of the metal pattern 130c may be positioned at the same level (or at the same line) in the second direction, i.e., the Y direction as the through hole 132-3 and the bump 230 located at the other end of the metal pattern 130c, but the through hole 132-3 and bump 230 located between the through holes 132-3 and the bumps 230 located at both ends of the metal pattern 130c may be located at different level in the second direction than the through holes 132-3 and the bumps 230 located at both ends of the metal pattern 130c.

The metal pattern 130c bonded with the bumps 230 may have the smaller width Pw7 and the larger widths Pw5 and Pw6 in the first direction, i.e., the X direction. Accordingly, the bonding portion R3 may have the larger widths Pw5 and Pw6, and thus a resistance characteristic may not deteriorate, and the bumps 230 may be located on the metal pattern 130c having the smaller width Pw7, and thus a bonding characteristic may not deteriorate.

Figure 8:
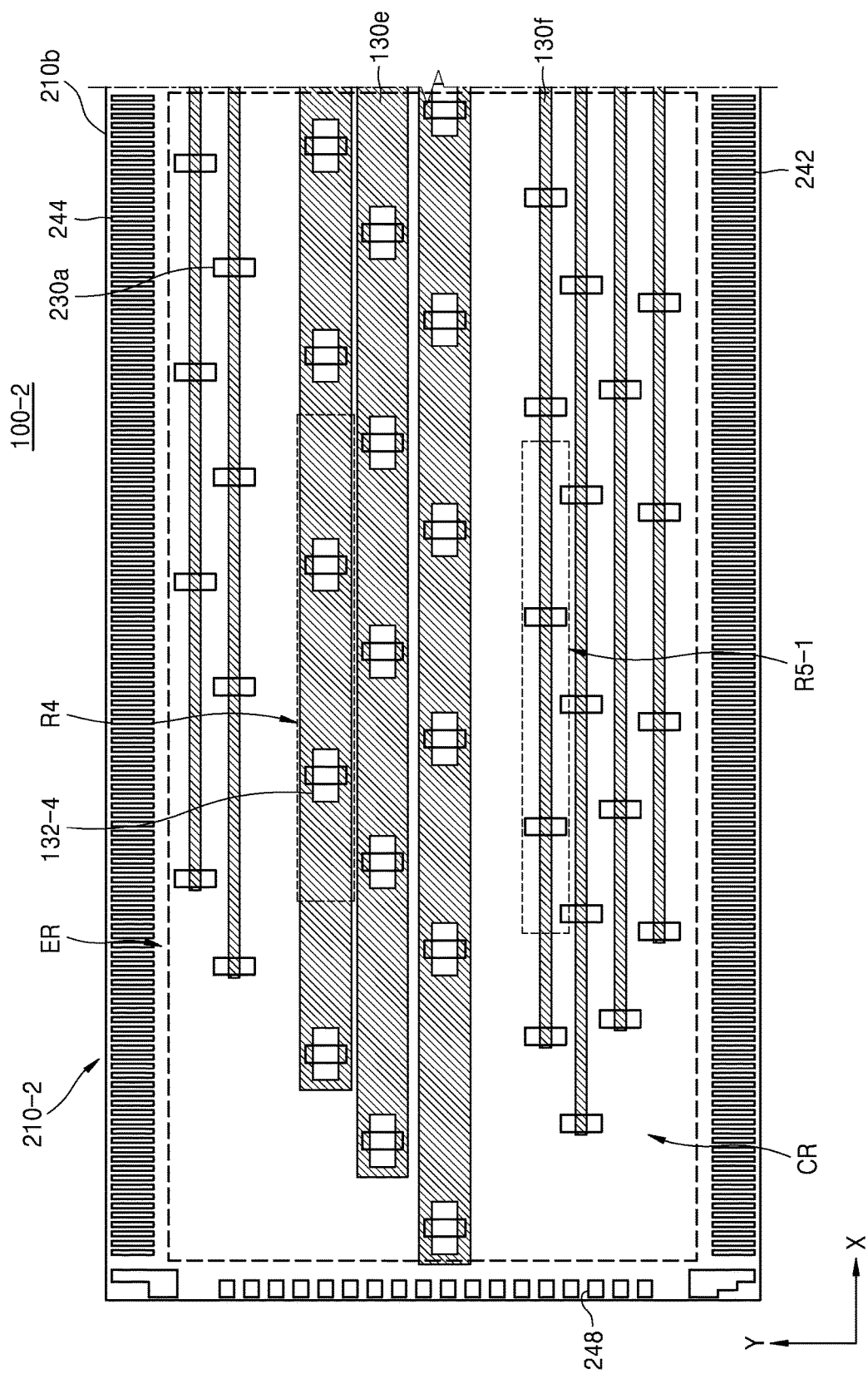
FIG. 8 is a diagram for describing a film type semiconductor package according to an exemplary embodiment.

FIG. 8 is a diagram for describing a film type semiconductor package 100-2 according to an exemplary embodiment.

In more detail, the film type semiconductor package 100-2 of FIG. 8 may correspond to the film type semiconductor package 100 of FIGS. 1 through 3. The film type semiconductor package 100-2 of FIG. 8 may be provided to describe a semiconductor chip 210-2 having a plurality of bumps 230a and a plurality of metal patterns 130e through 130f bonded with the semiconductor chip 210-2 through the bumps 230a.

FIG. 8 shows only a part of the film type semiconductor package 100-2. The semiconductor chip 210-2 may correspond to the semiconductor chip 210 of FIGS. 2 and 3. The metal patterns 130e through 130f may correspond to the metal pattern 130 of FIGS. 2 and 3. FIG. 8 may be the same as FIG. 4, except for different shapes or arrangements of the metal patterns 130e through 130f and the bumps 230a. For example, the bumps 230a of FIG. 8 may have a rectangular shape, but the disclosure is not limited thereto. The same reference numerals denote the same components in FIG. 8 and FIGS. 2 through 4.

The semiconductor chip 210-2 may include the plurality of edge pads 242, 244, and 248 formed in the edge region ER of the chip body 210b and a plurality of center pads (not shown) and the plurality of bumps 230a formed in the center region CR. In FIG. 8, since the bumps 230 may overlap each other to form the center pads, the center pads are not illustrated.

The metal patterns 130e through 130f may be formed on the film substrate 110 of FIG. 2. In FIG. 8, the film substrate 110 of FIG. 2 is not illustrated for convenience of illustration in order to describe bonding between the metal patterns 130e through 130f and the bumps 230a. The metal patterns 130e through 130f may extend at a certain length, e.g., a first length, in a first direction (a length direction), for example, an X direction, and may have a certain width, e.g., a first width, in a second direction (a width direction) perpendicular to the first direction, for example, a Y direction on the film substrate 110 of FIG. 2. Widths of the metal patterns 130e through 130f may be different.

Through holes 132-4 that penetrate the metal pattern 130e may be arranged in the metal pattern 130e among the metal patterns 130e through 130f. A plurality of through holes 132-4 may be spaced apart from each other in the first direction, i.e., the length direction. As described above, the semiconductor chip 210-2 may be mounted on the film substrate 110 of FIG. 2 and the metal patterns 130e through 130f.

More specifically, the bumps 230a formed on one surface of the semiconductor chip 210-2 may overlap the through holes 132-4 and may be bonded with the metal patterns 130e through 130f by using a thermal compression method. When the bumps 230a overlap the through holes 132-4 and are bonded with the metal patterns 130e through 130f, a bonding characteristic of the bumps 230a and the metal patterns 130e through 130f may be enhanced while not reducing an electrical characteristic, for example, a resistance characteristic.

For example, the bumps 230a may be bonded with the metal pattern 130e having a relatively broad width, and thus the electrical characteristic, for example, the resistance characteristic may not deteriorate. When the bumps 230a overlap the through holes 132-4 and are bonded with the metal pattern 130e, the bumps 230a may not be separated from the metal pattern 130e, and thus the bonding characteristic may be enhanced.

The bumps 230a formed on one surface of the semiconductor chip 210-2 may be directly bonded with the metal pattern 130f if necessary. The metal pattern 130f may have a smaller width than those of the metal pattern 130e. Accordingly, even when the metal pattern 130f is directly bonded with the bumps 230a through a through hole, the metal pattern 130f and the bumps 230a may be bonded with each other without being separated from each other.

The through holes 132-4 having various shapes may be formed in the metal pattern 130e in order to enhance the bonding characteristic of the metal pattern 130e and the bumps 230a. The film type semiconductor package 100-2 of FIG. 8 may include bonding portions R4 and R5-1 of the metal patterns 130e through 130f and the bumps 230a.

The bonding portion R4 that bonds the metal pattern 130e and the bumps 230a by using the through holes 132-4 and the bonding portion R5-1 that directly bonds the metal pattern 130f and the bumps 230a will be described in detail with reference to FIGS. 9A through 10C below.

The bonding region R5 that directly bonds the metal pattern 130d and the bumps 230 shown above may be the same as the bonding portion R5-1 that directly bonds the metal pattern 130f and the bumps 230a, except for sizes or widths of the metal patterns 130d and 130f and the bumps 230 and 230a.

Figure 9A:
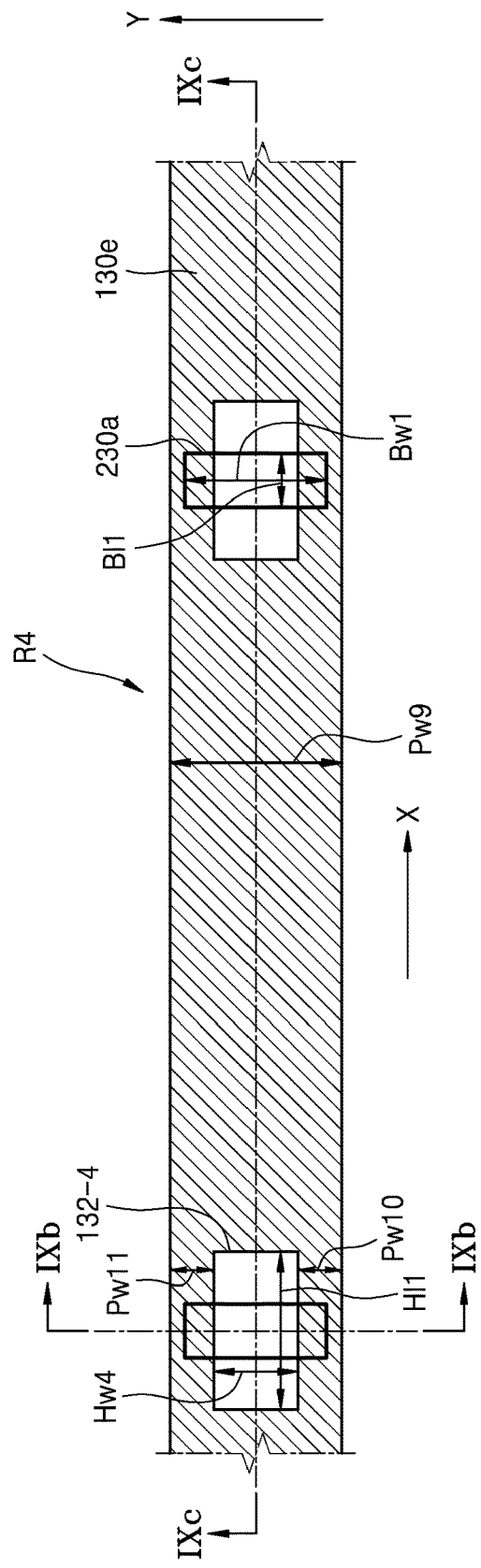
FIGS. 9A through 9C are diagrams for describing a bonding portion between a metal pattern and bumps of FIG. 8.
Figure 9B:
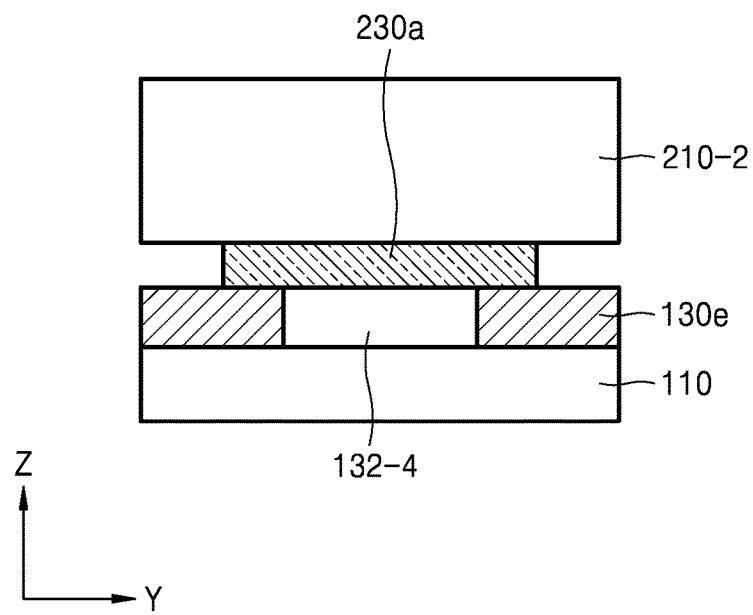
Figure 9C:
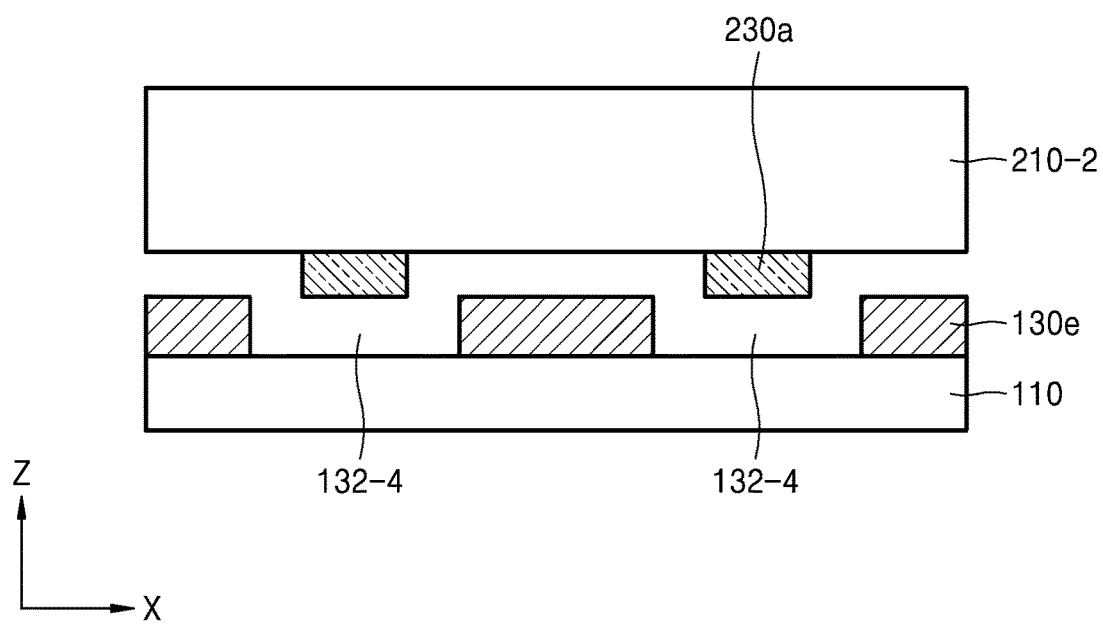

FIGS. 9A through 9C are diagrams for describing the bonding portion R4 between the metal pattern 130e and the bumps 230a of FIG. 8.

In more detail, FIG. 9A is a plan view for describing the bonding portion R4 between the metal pattern 130e and the bumps 230a, and FIGS. 9B and 9C are cross-sectional views taken along lines IXb-IXb and IXc-IXc of FIG. 9A, respectively. The metal pattern 130e may extend in a first direction (a length direction), i.e., an X direction, and may have a width Pw9 in a second direction (a width direction), i.e., a Y direction. The through holes 132-4 may have a longer length in the first direction (the length direction), i.e., the X direction and may have a shorter width in the second direction (the width direction), i.e., the Y direction. The through holes 132-4 may have a length Hl1 in the first direction and a width Hw4 in the second direction where the length Hl1 is larger than the width Hw4. The metal pattern 130e in contact with the through hole 132-4 may have comparatively smaller widths Pw10 and Pw11. The width Pw10 may be the same as the width Pw11 in one embodiment and greater or smaller than the width Pw11 in another embodiment.

The semiconductor chip 210-2 including the bumps 230a may be bonded on the metal pattern 130e formed on the film substrate 110 by using a thermal compression method. The bumps 230a may have a shorter length in the first direction (the length direction) and may have a longer width in the second direction (the width direction), i.e., the Y direction. The bumps 230a may have a length Bl1 in the first direction, i.e., the X direction and a width Bw1 in the second direction, i.e., the Y direction where the length Bl1 is shorter than the width Bw1. The through holes 132-4 and the bumps 230a may be located at the same level (or at the same line) in the second direction on the metal pattern 130e. For example, the through hole 132-4 and the bump 230 located at one end of the metal pattern 130a may be positioned at the same level (or at the same line) in the second direction, i.e., the Y direction as the through hole 132-1 and the bump 230 located at the other end of the metal pattern 130a.

The bumps 230a may be located on the through holes 132-4 as shown in FIG. 9C. The bumps 230a may partially overlap the metal pattern 130e due to the through holes 132-4 as shown in FIG. 9B. The bumps 230a bonded with the metal pattern 130e may partially overlap the through holes 132-4.

The metal pattern 130e bonded with the bumps 230a may have the smaller width Pw11 and the larger width Pw9 in the first direction, i.e., the X direction. Accordingly, the bonding portion R4 may have the great width Pw9, and thus a resistance characteristic may not deteriorate, and the bumps 230a may be located on the metal pattern 130e having the smaller widths Pw10 and PW11, and thus a bonding characteristic may not deteriorate.

Figure 10A:
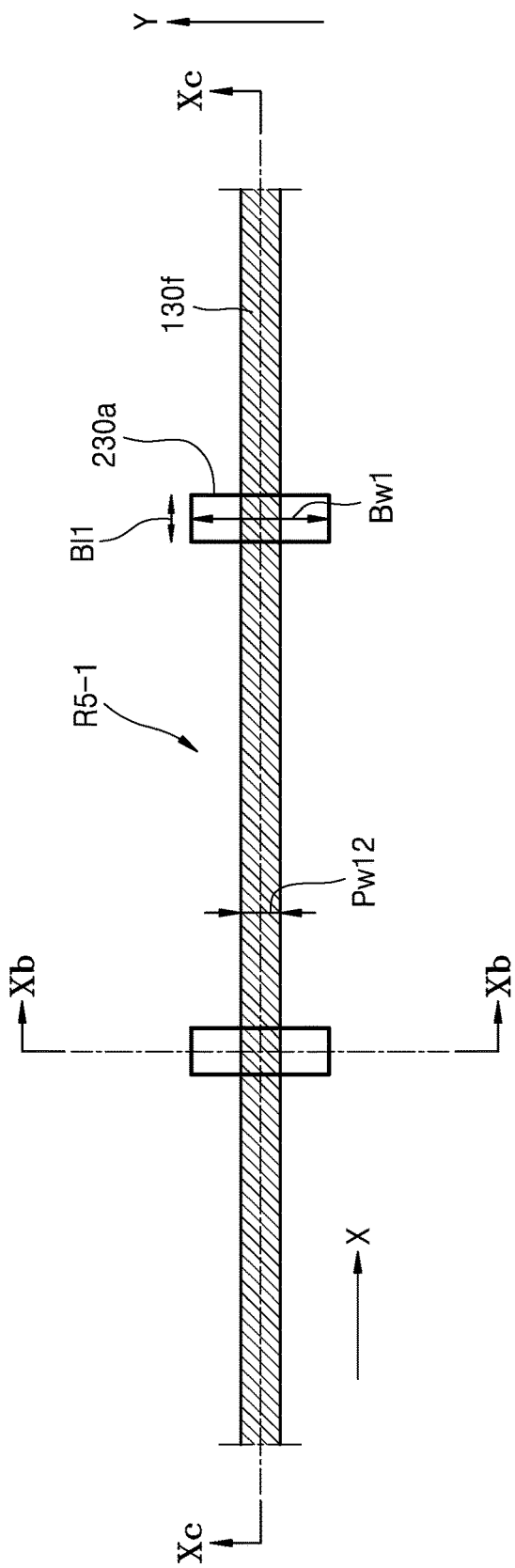
FIGS. 10A through 10C are diagrams for describing a bonding portion between a metal pattern and bumps of FIG. 8.
Figure 10B:
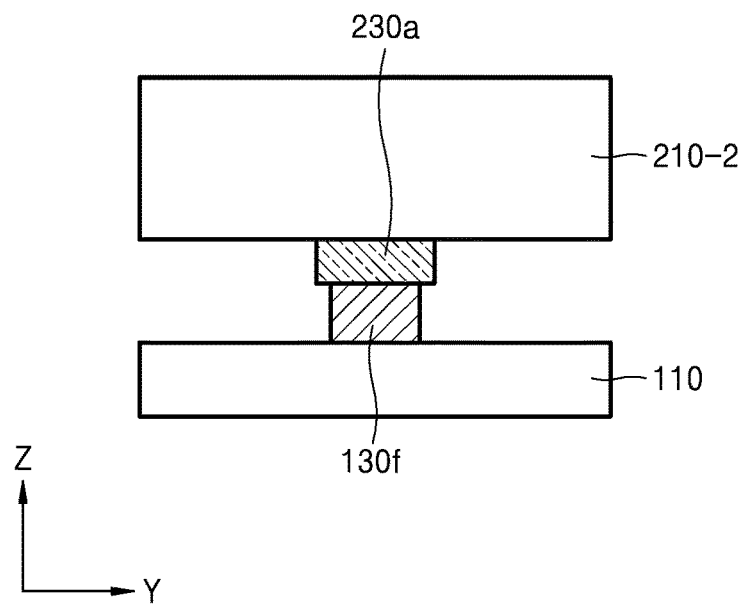
Figure 10C:
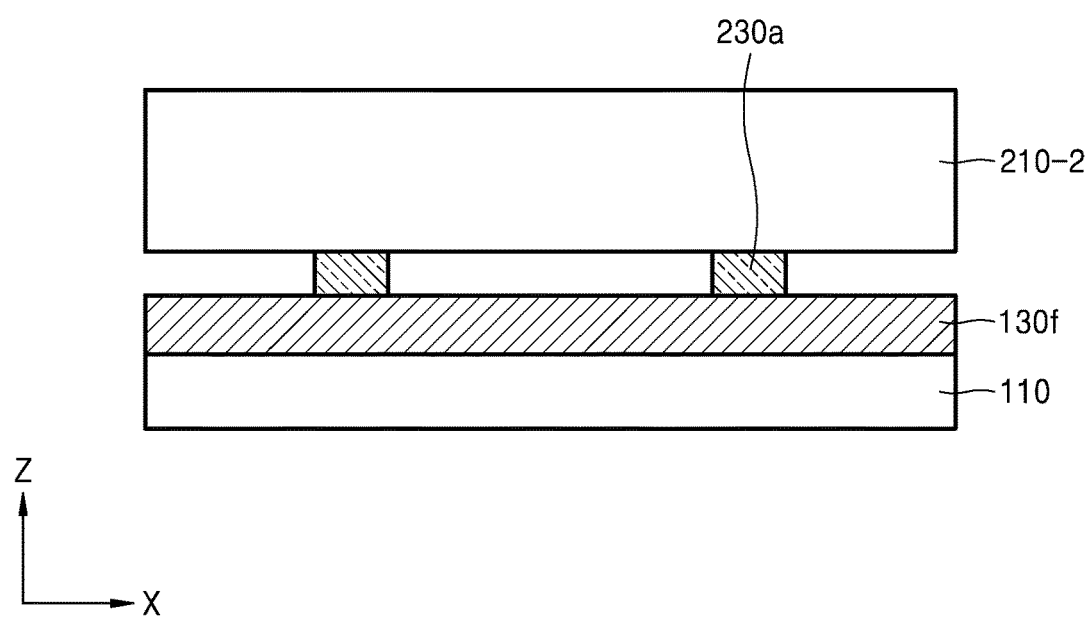

FIGS. 10A through 10C are diagrams for describing the bonding portion R5-1 between the metal pattern 130f and the bumps 230a of FIG. 8.

In more detail, FIG. 10A is a plan view for describing the bonding portion R5-1 between the metal pattern 130f and the bumps 230a, and FIGS. 10B and 10C are cross-sectional views taken along lines Xb-Xb and Xc-Xc of FIG. 10A, respectively. The metal pattern 130f may extend in a first direction (a length direction), i.e., an X direction, and may have a width Pw12 in a second direction (a width direction), i.e., a Y direction.

The semiconductor chip 210-2 including the bumps 230a may be bonded on the metal pattern 130f formed on the film substrate 110 by using a thermal compression method. The bumps 230a may have the length Bl1 in the first direction, i.e., the X direction and the width Bw1 in the second direction, i.e., the Y direction, where the length Bl1 is smaller than the width Bw1. The metal pattern 130f may partially overlap the bumps 230a as shown in FIG. 10A. The bumps 230a may be located at the same level (or at the same line) in the second direction on the metal pattern 130e.

The bumps 230a may be bonded with the metal pattern 130f as shown in FIGS. 10B and 10C. The metal pattern 130f bonded with the bumps 230a may have the smaller width Pw12 in the first direction, i.e., the X direction.

Figure 11:
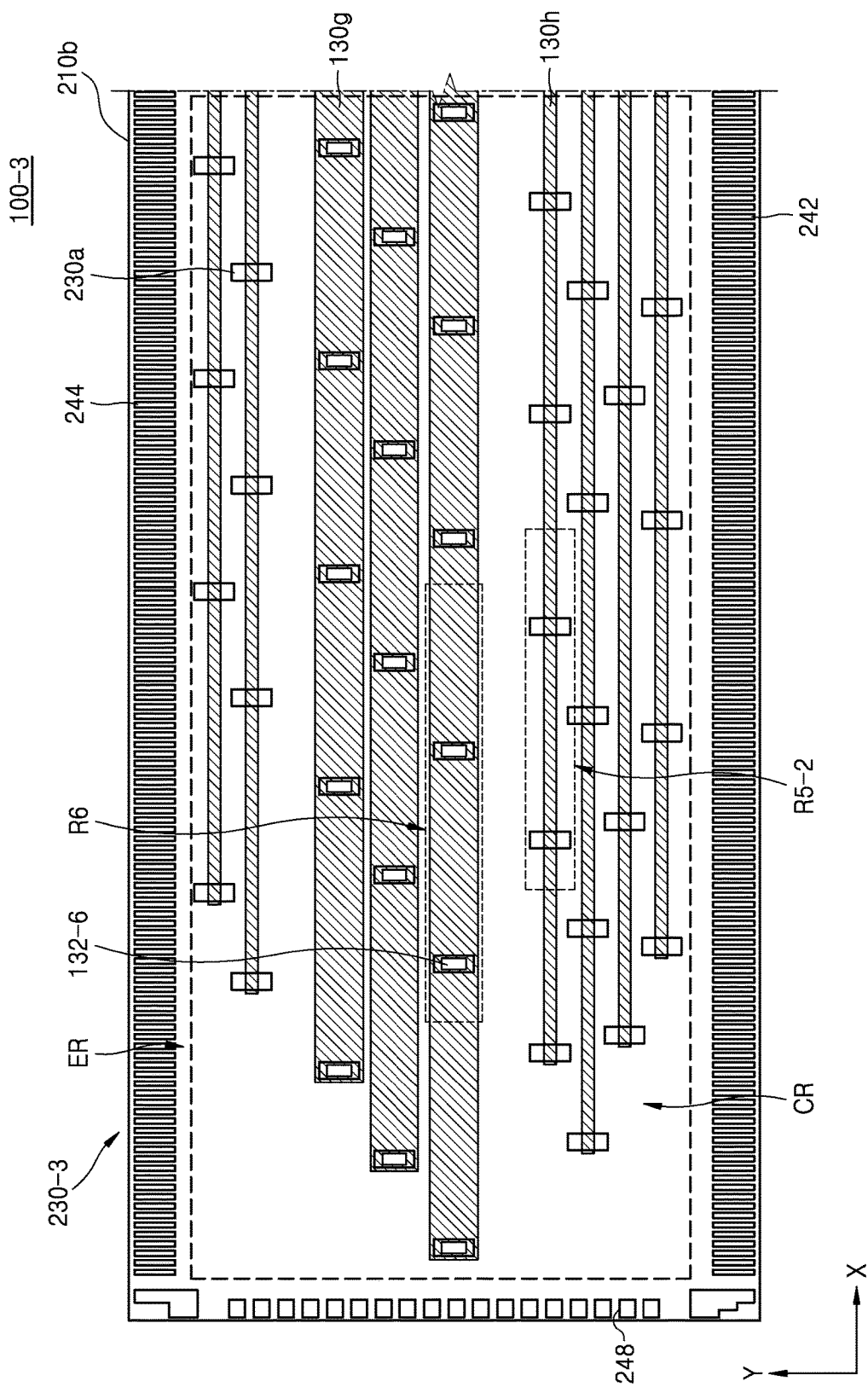
FIG. 11 is a diagram for describing a film type semiconductor package according to an exemplary embodiment.

FIG. 11 is a diagram for describing a film type semiconductor package 100-3 according to an exemplary embodiment.

In more detail, the film type semiconductor package 100-3 of FIG. 11 may correspond to the film type semiconductor package 100 of FIGS. 1 through 3. The film type semiconductor package 100-3 of FIG. 11 may be provided to describe a semiconductor chip 210-3 having the plurality of bumps 230a and a plurality of metal patterns 130g and 130h bonded with the semiconductor chip 210-3 through the bumps 230a.

FIG. 11 shows only a part of the film type semiconductor package 100-3. The semiconductor chip 210-3 may correspond to the semiconductor chip 210 of FIGS. 2 and 3. The metal patterns 130g and 130h may correspond to the metal pattern 130 of FIGS. 2 and 3. FIG. 11 may be the same as FIGS. 4 and 8, except for different shapes or arrangements of the metal patterns 130g and 130h and the bumps 230a. For example, the bumps 230a of FIG. 11 may have a rectangular shape, but the disclosure is not limited thereto. The same reference numerals denote the same components in FIG. 11 and FIGS. 4 and 8.

The semiconductor chip 210-3 may include the plurality of edge pads 242, 244, and 248 formed in the edge region ER of the chip body 210b and a plurality of center pads (not shown) and the plurality of bumps 230a formed in the center region CR. In FIG. 11, since the bumps 230a may overlap each other to form the center pads, the center pads are not illustrated.

The metal patterns 130g and 130h may be formed on the film substrate 110 of FIG. 2. In FIG. 11, the film substrate 110 of FIG. 2 is not illustrated for convenience of illustration in order to describe bonding between the metal patterns 130g and 130h and the bumps 230a. The metal patterns 130g and 130h may extend at a certain length, e.g., a first length, in a first direction (a length direction), for example, an X direction, and may have a certain width, e.g., a first width, in a second direction (a width direction) perpendicular to the first direction, for example, a Y direction on the film substrate 110 of FIG. 2. Widths of the metal patterns 130g and 130h may be different.

Through holes 132-6 that penetrate the metal pattern 130g may be arranged in the metal pattern 130g among the metal patterns 130g and 130h. A plurality of the through holes 132-6 may be spaced apart from each other in the first direction, i.e., the length direction. As described above, the semiconductor chip 210-3 may be mounted on the film substrate 110 of FIG. 2 and the metal patterns 130g and 130h.

More specifically, the bumps 230a formed on one surface of the semiconductor chip 210-3 may wholly, e.g., completely or entirely, overlap the through holes 132-6 and may be bonded with the metal pattern 130g by using a thermal compression method. When the bumps 230a overlap the through holes 132-6 and are bonded with the metal pattern 130g, a bonding characteristic of the bumps 230a and the metal pattern 130g may be enhanced while not reducing an electrical characteristic, for example, a resistance characteristic.

For example, the bumps 230a may be bonded with the metal pattern 130g having a relatively broader width, and thus the electrical characteristic, for example, the resistance characteristic may not deteriorate. When the bumps 230a overlap the through holes 132-6 and are bonded with the metal pattern 130g, the bumps 230a may not be separated from the metal pattern 130g, and thus the bonding characteristic may be enhanced.

The bumps 230a formed on one surface of the semiconductor chip 210-2 may be directly bonded with the metal pattern 130h if necessary. The metal pattern 130h may have a relatively smaller width than those of the metal pattern 130g. Accordingly, even when the metal pattern 130h is directly bonded with the bumps 230a through a through hole, the metal pattern 130h and the bumps 230a may be bonded with each other without being separated from each other.

The film type semiconductor package 100-3 of FIG. 11 may include bonding portions R6 and R5-2 of the metal patterns 130g and 130h and the bumps 230a. The bonding portion R6 that bonds the metal pattern 130f and the bumps 230a by using the through holes 132-6 will be described in detail with reference to FIGS. 12A through 12C below. The bonding portion R5-2 that directly bonds the metal pattern 130h and the bumps 230a is the same as described with reference to FIGS. 10A through 10C above, and thus its description is omitted.

Figure 12A:
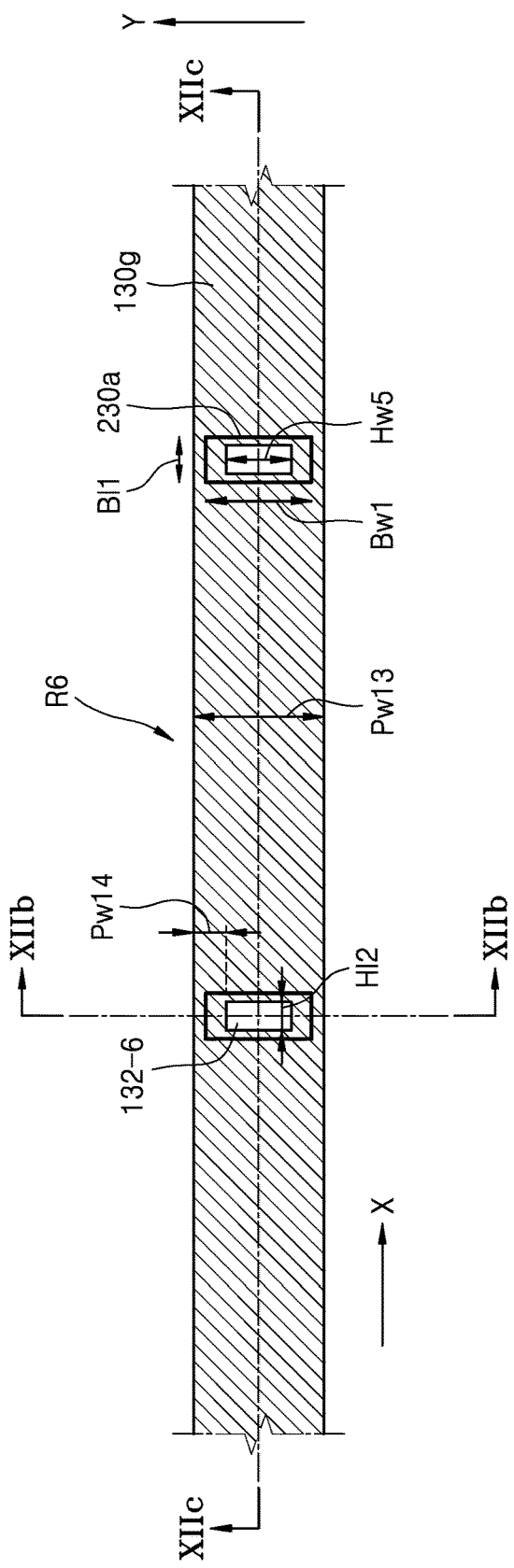
FIGS. 12A through 12C are diagrams for describing a bonding portion between a metal pattern and bumps of FIG. 11.
Figure 12B:
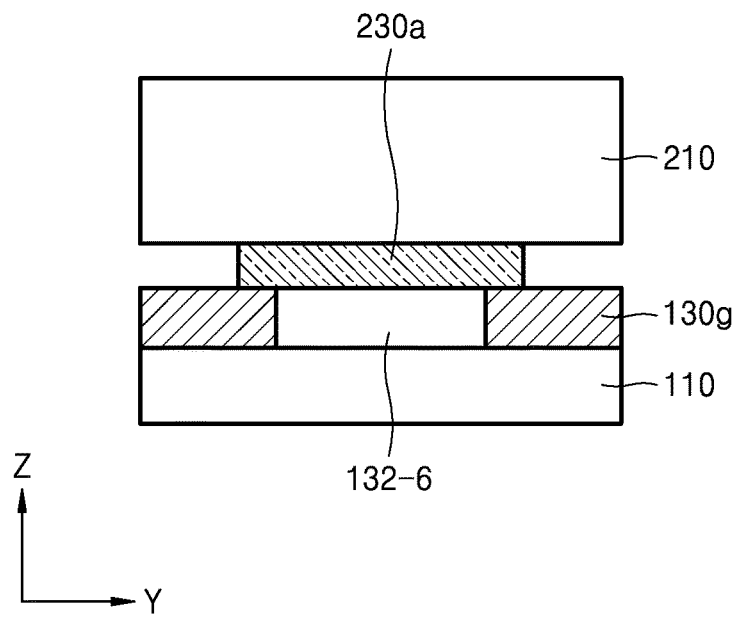
Figure 12C:
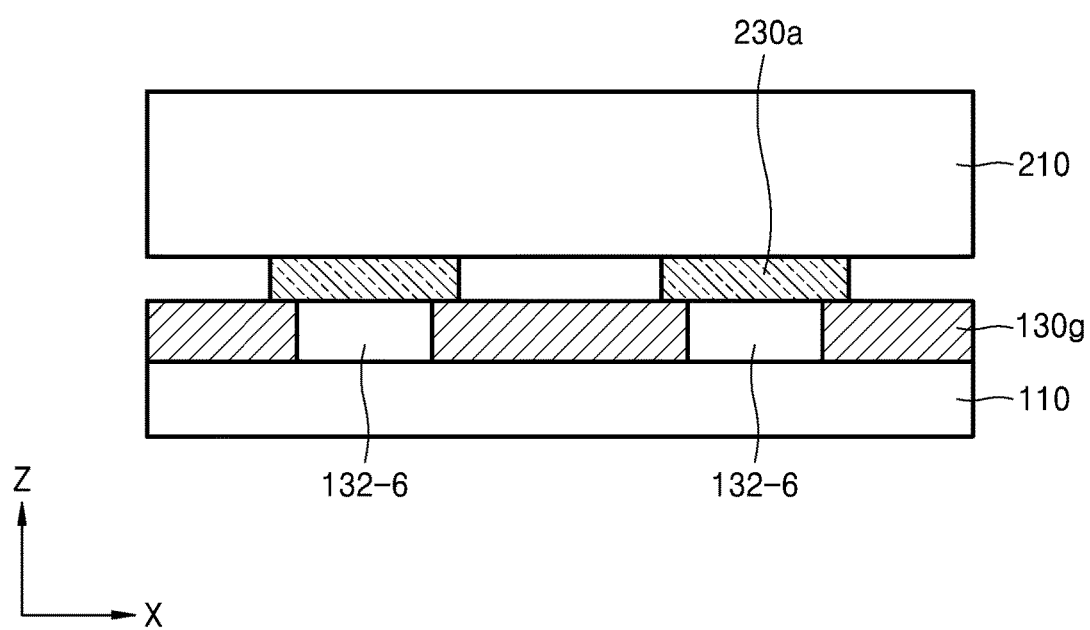

FIGS. 12A through 12C are diagrams for describing the bonding portion R6 between the metal pattern 130g and the bumps 230a of FIG. 8.

In more detail, FIG. 12A is a plan view for describing the bonding portion R6 between the metal pattern 130g and the bumps 230a, and FIGS. 12B and 12C are cross-sectional views taken along lines XIIb-XIIb and XIIc-XIIc of FIG. 11A, respectively. The metal pattern 130g may extend in a first direction (a length direction), i.e., an X direction, and may have a width Pw13 in a second direction (a width direction), i.e., a Y direction. The through holes 132-6 may be spaced apart from each other in the first direction in the metal pattern 130g. The through holes 132-6 may have a comparatively shorter length in the first direction (the length direction), i.e., the X direction and may have a longer width in the second direction (the width direction), i.e., the Y direction. The through holes 132-6 may have a length H12 in the first direction and a width Hw5 in the second direction where the length H12 is smaller than the width Hw5. The metal pattern 130g of one side in contact with the through holes 132-6 may have a width Pw14 where the width Pw14 is smaller than the width Pw13 in the second direction, i.e., the Y direction.

The semiconductor chip 210-3 including the bumps 230a may be bonded on the metal pattern 130g formed on the film substrate 110 by using a thermal compression method. The bumps 230a may have a shorter length in the first direction (the length direction) and may have a longer width in the second direction (the width direction), i.e., the Y direction. The bumps 230a may have the length Bl1 in the first direction and the width Bw1 in the second direction where the length Bl1 is smaller than the width Bw1. The metal pattern 130g may wholly, i.e., completely or entirely, overlap the through holes 132-6. The through holes 132-6 and the bumps 230a may be located at the same level in the second direction on the metal pattern 130g.

The bumps 230a may be located on the through holes 132-6 as shown in FIG. 12C. The bumps 230a may wholly, i.e., completely or entirely, overlap the metal pattern 130g due to the through holes 132-6 as shown in FIG. 12B.

The metal pattern 130g bonded with the bumps 230a may have the smaller width Pw14 and the larger width Pw13 in the first direction, i.e., the X direction. Accordingly, the bonding portion R6 may have the great width Pw13, and thus a resistance characteristic may not deteriorate, and the bumps 230a may be located on the metal pattern 130g having the smaller width Pw12, and thus a bonding characteristic may not deteriorate.

Figure 13:
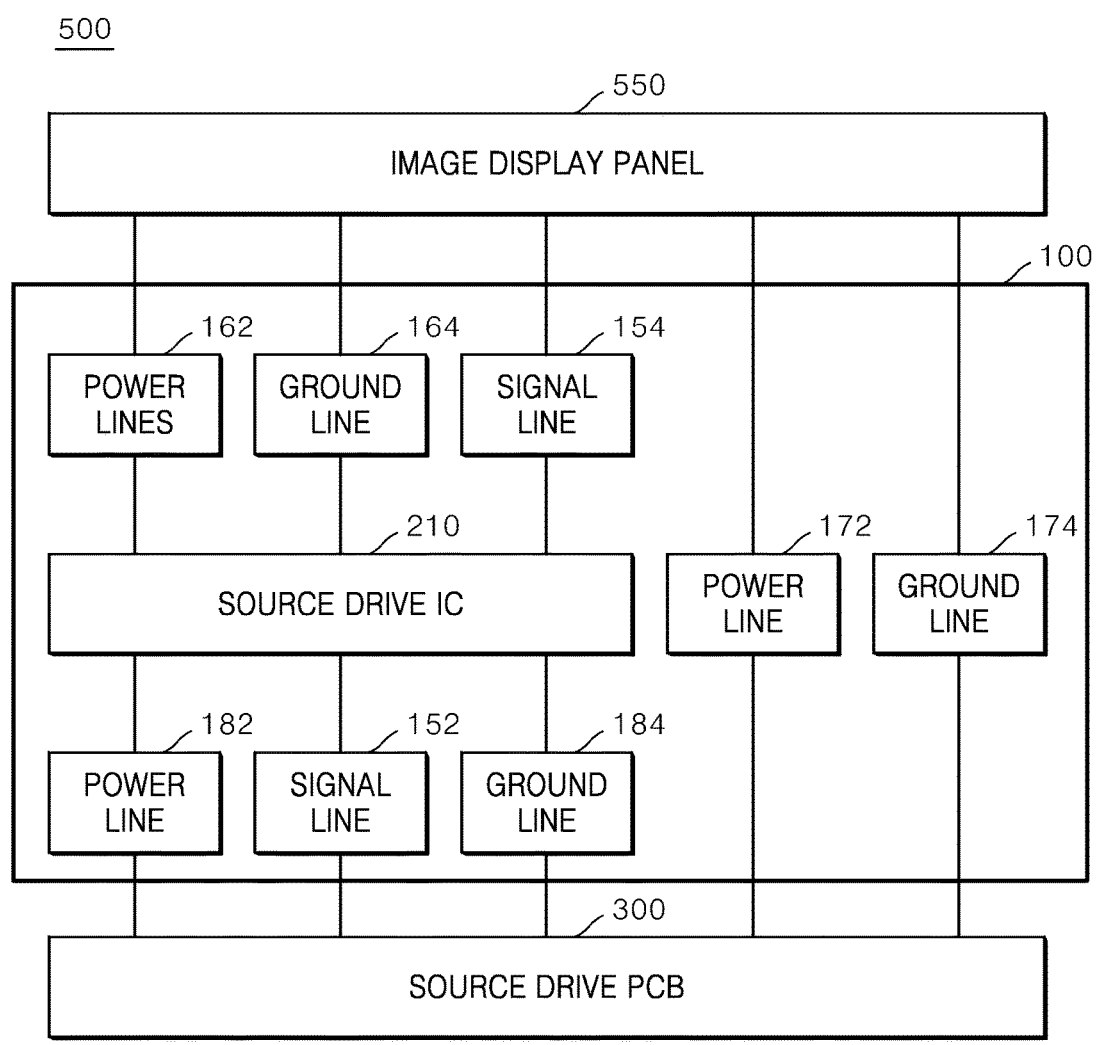
FIG. 13 is a block diagram of a main configuration of a display device including a film type semiconductor package according to an exemplary embodiment.

FIG. 13 is a block diagram of a main configuration of the display device 500 including the film type semiconductor package 100 according to an exemplary embodiment.

In more detail, the display device 500 may include the image display panel 550 and the source drive PCB 300 for supplying a driving signal to the image display panel 550 through the film type semiconductor package 100. The image display pane 1550 may be, for example, a liquid crystal display panel.

Although not shown, the source drive PCB 300 may include a power supply, a memory, a programming unit, a buffer, etc. therein. Electric power supplied to the power supply of the source drive PCB 300 from an external power supply source may be provided to the memory, the programming unit, the buffer, etc. of the source drive PCB 300. The power supply of the source drive PCB 300 may supply a power voltage to the image display panel 550 through the film type semiconductor package 100 to display an image.

The semiconductor chip 210 such as a source drive IC for supplying the driving signal to the image display panel 550 from the source drive PCB 300 may be mounted on the film type semiconductor package 100. As described above, the power voltage and display operation signals may be provided to the image display panel 550 through the film substrate 110 of FIG. 2 and the semiconductor chip 210 such as the source drive IC mounted on the film substrate 110 of FIG. 2.

A signal line 152 may be connected between the source drive PCB 300 and the semiconductor package 210 on the film type semiconductor package 100. The signal line 152 may configure an input circuit. A signal line 154 may be formed between the semiconductor chip 210 and the image display panel 550 on the film type semiconductor package 100. The signal line 154 may configure an output circuit.

A power line 182 and a ground line 184 may be connected between the source drive PCB 300 and the semiconductor package 210 on the film type semiconductor package 100. A power line 162 and a ground line 164 may be connected between the semiconductor chip 210 and the image display pane 1550 on the film type semiconductor package 100.

The power lines 162 and 182 and the ground lines 164 and 184 may be provided to supply predetermined signals to the image display panel 550. The power lines 162 and 182 and the ground lines 164 and 184 may be electrically connected to the metal pattern 130 of the semiconductor chip 210 as described above. A power line 172 and a ground line 174 may be formed between the source drive PCB 300 and the image display panel 550 on the film type semiconductor package 100.

While the inventive concept has been particularly shown and described with reference to embodiments thereof, it will be understood that various changes in form and details may be made therein without departing from the spirit and scope of the following claims.

What is claimed is:

1. A film type semiconductor package comprising:
a film substrate;
a metal pattern extending a first length in a first direction on the film substrate, having a first width in a second direction perpendicular to the first direction, wherein the first length in the first direction is larger than the first width in the second direction, and comprising a plurality of through holes spaced apart from each other in the first direction;
a semiconductor chip comprising a plurality of pads; and
a plurality of bumps spaced apart from each other in the first direction, bonded with the metal pattern, and overlapping the plurality of through holes and connected to the pads of the semiconductor chip,
wherein each of the plurality of through holes is arranged in the metal pattern spaced apart from each other in the first direction and penetrates the metal pattern.

2. The film type semiconductor package of claim 1, wherein the plurality of bumps partially overlap the plurality of through holes.

3. The film type semiconductor package of claim 1, wherein the plurality of bumps completely overlap the plurality of through holes.

4. The film type semiconductor package of claim 1, wherein the plurality of through holes comprise a first through hole and a second through hole spaced apart from each other in the second direction.

5. The film type semiconductor package of claim 4, wherein each bump of the plurality of bumps are bonded with the metal pattern through the first through hole and the second through hole.

6. The film type semiconductor package of claim 4, wherein a first width in the second direction of the metal pattern extending in the second direction between the outermost edges of the metal pattern is larger than a second width in the second direction of a bonding area of the metal pattern bonded to a bump between the first through hole and the second through hole in the second direction.

7. The film type semiconductor package of claim 1, wherein each of the plurality of bumps is located on each of a plurality of center pads formed on a center region of the semiconductor chip, the plurality of center pads being power pads or ground pads.

8. The film type semiconductor package of claim 1, wherein the plurality of through holes and the plurality of bumps are located at a same level in the second direction on the metal pattern.

9. The film type semiconductor package of claim 1, wherein the plurality of through holes and the plurality of bumps are located at different levels in the second direction on the metal pattern.

10. The film type semiconductor package of claim 1,
wherein each of the plurality of through holes has a length in the first direction and a width in the second direction, the length being larger than the width,
wherein the metal pattern partially overlaps the plurality of bumps, and
wherein the plurality of bumps partially overlap the film substrate.

11. The film type semiconductor package of claim 1,
wherein each of the plurality of through holes has a length in the first direction and a width in the second direction, the length being larger than the width, and
wherein the plurality of bumps partially overlap the plurality of through holes.

12. The film type semiconductor package of claim 1,
wherein each of the plurality of through holes has a length in the first direction and a width in the second direction, the length being smaller than the width,
wherein the metal pattern completely overlaps the plurality of bumps, and
wherein the plurality of bumps completely overlap the plurality of through holes.

13. A film type semiconductor package comprising:
a film substrate;
a plurality of metal patterns extending in a first direction on the film substrate and being spaced apart from each other in a second direction perpendicular to the first direction, some of the plurality of metal patterns comprising a plurality of through holes spaced apart from each other in the first direction; and
a semiconductor chip comprising a plurality of bumps directly bonded with the plurality of metal patterns and overlapping the plurality of through holes,
wherein each of the plurality of through holes is arranged in corresponding metal pattern spaced apart from each other in the first direction and penetrates the corresponding metal pattern.

14. The film type semiconductor package of claim 13, wherein some of the plurality of through holes provided on some of the plurality of metal patterns comprise a first through hole and a second through hole spaced apart from each other in the second direction.

15. The film type semiconductor package of claim 13, wherein some of the plurality of through holes provided on some of the plurality of metal patterns are located at a same level or at different levels in the second direction.

16. The film type semiconductor package of claim 13, wherein some of the plurality of through holes provided on some of the plurality of metal patterns partially or completely overlap the plurality of bumps.

17. A film type semiconductor package comprising:
a film substrate;

a metal pattern having a first length in a first direction on the film substrate, and a second length in a second direction perpendicular to the first direction, wherein the first length is larger than the second length, and comprising a plurality of through holes spaced apart from each other in the first direction; and a semiconductor chip comprising a plurality of bumps spaced apart from each other in the first direction, the bumps bonded with the metal pattern and overlapping the plurality of through holes, wherein each of the plurality of through holes is arranged in the metal pattern spaced apart from each other in the first direction and penetrates the metal pattern.

18. The film type semiconductor package of claim 17, wherein the plurality of through holes included in the film type semiconductor package comprise a first through hole and a second through hole spaced apart from each other in the second direction.

19. The film type semiconductor package of claim 18, wherein a first width in the second direction of the metal pattern extending in the second direction between the outermost edges of the metal pattern is larger than a second width in the second direction of a bonding area of the metal pattern bonded to the bump between the first through hole and the second through hole in the second direction.

20. The film type semiconductor package of claim 17,
wherein each of the plurality of through holes has a length in the first direction and a width in the second direction, the length being smaller than the width, and wherein the plurality of bumps completely overlap the plurality of through holes.

* * * * *